US009007834B2

(12) United States Patent
Rhie

(10) Patent No.: US 9,007,834 B2
(45) Date of Patent: Apr. 14, 2015

(54) NONVOLATILE MEMORY WITH SPLIT SUBSTRATE SELECT GATES AND HIERARCHICAL BITLINE CONFIGURATION

(71) Applicant: Mosaid Technologies Incorporated, Ottawa (CA)

(72) Inventor: Hyoung Seub Rhie, Ottawa (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 5 days.

(21) Appl. No.: 13/830,054

(22) Filed: Mar. 14, 2013

(65) Prior Publication Data
US 2014/0192596 A1      Jul. 10, 2014

Related U.S. Application Data

(60) Provisional application No. 61/750,955, filed on Jan. 10, 2013.

(51) Int. Cl.
*G11C 16/04*         (2006.01)
*G11C 11/56*         (2006.01)
*G11C 16/14*         (2006.01)

(52) U.S. Cl.
CPC ........ *G11C 11/5635* (2013.01); *G11C 16/0483* (2013.01); *G11C 16/14* (2013.01)

(58) Field of Classification Search
USPC ........ 365/185.17, 185.13, 185.11, 185.29, 63
See application file for complete search history.

(56) References Cited

U.S. PATENT DOCUMENTS

| | | | |
|---|---|---|---|
| 5,473,563 A | 12/1995 | Suh et al. | |
| 6,560,162 B2 | 5/2003 | Kwon | |
| 7,161,837 B2 | 1/2007 | Park | |
| 7,245,530 B2 * | 7/2007 | Ichikawa et al. | 365/185.05 |
| 7,312,503 B2 * | 12/2007 | Umezawa et al. | 257/390 |
| 7,440,326 B2 | 10/2008 | Ito | |
| 7,525,841 B2 | 4/2009 | Aritome | |

(Continued)

FOREIGN PATENT DOCUMENTS

CA          2334287          12/1999

OTHER PUBLICATIONS

Suh, K. et al, "A 3.3 V 32 MB NAND Flash Memory With Incremental Step Pulse Programming Scheme", IEEE Journal of Solid-State Circuits, vol. 30, No. 11, Nov. 1995, pp. 1149-1156.

(Continued)

*Primary Examiner* — David Lam
(74) *Attorney, Agent, or Firm* — Shin Hung; Borden Ladner Gervais LLP

(57) ABSTRACT

Generally, the present disclosure provides a non-volatile memory device having a hierarchical bitline structure for preventing erase voltages applied to one group of memory cells of the memory array from leaking to other groups in which erasure is not required. Local bitlines are coupled to the memory cells of each group of memory cells. Each local bitline can be selectively connected to a global bitline during read operations for the selected group, and all the local bitlines can be disconnected from the global bitline during an erase operation when a specific group is selected for erasure. Select devices for electrically connecting each bitline of a specific group of memory cells to the global bitline have device bodies that are electrically isolated from the bodies of those memory cells.

22 Claims, 22 Drawing Sheets

(56) References Cited

U.S. PATENT DOCUMENTS

| | | | |
|---|---|---|---|
| 7,551,492 B2 | 6/2009 | Kim | |
| 7,835,184 B2 * | 11/2010 | Ratnakumar et al. | 365/185.18 |
| 7,852,676 B2 | 12/2010 | Maejima | |
| 7,885,115 B2 | 2/2011 | Lee et al. | |
| 7,940,578 B2 | 5/2011 | Kang et al. | |
| 7,944,752 B2 | 5/2011 | Lee | |
| 7,978,518 B2 | 7/2011 | Pyeon et al. | |
| 7,994,011 B2 | 8/2011 | Park et al. | |
| 8,045,386 B2 | 10/2011 | Santin et al. | |
| 8,085,616 B2 | 12/2011 | Ryu | |
| 8,111,553 B2 * | 2/2012 | Seo et al. | 365/185.13 |
| 8,189,390 B2 | 5/2012 | Kim | |
| 8,189,391 B2 | 5/2012 | Itagaki et al. | |
| 8,199,573 B2 | 6/2012 | Fukuzumi et al. | |
| 8,203,211 B2 | 6/2012 | Jeong et al. | |
| 8,203,882 B2 | 6/2012 | Hishida et al. | |
| 8,259,503 B2 | 9/2012 | Park et al. | |
| 8,264,031 B2 | 9/2012 | Kidoh et al. | |
| 8,278,170 B2 | 10/2012 | Lee et al. | |
| 8,278,695 B2 | 10/2012 | Kidoh et al. | |
| 2006/0083062 A1 | 4/2006 | Park | |
| 2011/0170352 A1 | 7/2011 | Kim | |
| 2012/0181699 A1 | 7/2012 | Chen et al. | |
| 2012/0182802 A1 | 7/2012 | Hung et al. | |
| 2012/0182806 A1 | 7/2012 | Chen et al. | |

OTHER PUBLICATIONS

Tanaka, et al., "Bit Cost Scalable Technology with Punch and Plug Process for Ultra High Density Flash Memory", Center for Semiconductor Research and Development and Process and Manufacturing Engineering Center, Toshiba Corporation, Semiconductor Company, 2007 Symposium on VLSI Technology Digest of Technical Papers, Jun. 2007, pp. 14-15.
Jang, et al., "Vertical Cell Array using TCAT (Terabit Cell Array Transistor) Technology for Ultra High Density NAND Flash Memory", Advanced Technology Development Team 2 and Process Development Team, Memory R and D Center, Memory Division, Samsung Electronics Co. Ltd., 2009 Symposium on VLSI Technology Digest of Technical Papers, Jun. 2009, pp. 192-193.
Yoohyun Noh et al, "A New Metal Control Gate Last Process (MCGL Process) for High Performance DC-SF (Dual Control Gate With Surrounding Floating Gate) 3D NAND Flash Memory", 2012 Symposium on VLSI Technology Digest of Technical Papers; Jun. 2012, pp. 19-20.
Fukuzumi, et al., "Optimal Integration and Characteristics of Vertical Array Devices for Ultra-High Density, Bit-Cost Scalable Flash Memory", Center for Semiconductor Research and Development, Toshiba Corporation, Semiconductor Company, Toshiba Information Systems (Japan) Corporation, Dec. 2007, pp. 449-452.
Akihiro Nitayama et al, "Bit Cost Scalable (BiCS) Flash Technology for Future Ultra High Density Storage Devices", VLSI Technology Systems and Applications (VLSI TSA), 2010 International Symposium, Apr. 2010, pp. 130-131.
Megumi Ishiduki et al, "Optimal Device Structure for Pipe-shaped BiCS Flash Memory for Ultra High Density Storage Device with Excellent Performance and Reliability", Electron Devices Meeting (IEDM), 2009 IEEE International, Dec. 2009, pp. 27.3.1-27.3.4.
Yosuke Komori et al, "Disturbless Flash Memory due to High Boost Efficiency on BiCS Structure and Optimal Memory Film Stack for Ultra High Density Storage Device", 2008 Electron Devices Meeting, Dec. 2008, pp. 1-4.
Ryota Katsumata et al, "Pipe-shaped BiCS Flash Memory with 16 Stacked Layers and Multi-Level-Cell Operation for Ultra High Density Storage Devices", 2009 VLSI Technology Symposium, Jun. 2009, pp. 136-137.
Ki-Tae Park et al, "A 45nm 4Gb 3-Dimensional Double-Stacked Multi-Level NAND Flash Memory with Shared Bitline Structure", Solid-State Circuits Conference, ISSCC 2008 Digest of Technical Papers,, pp. 510-511 and 632, Feb. 6, 2008.
Jin-Ki Kim et al, "A 120mm2 64Mb NAND Flash Memory Achieving 180ns/Byte Effective Program Speed", 1996 Symposium on VLSI Circuits Digest of Technical Papers, Jun. 1996, pp. 168-169.
Lee, June et al, "High-Performance 1-GB NAND Flash Memory With .012-um Technology", IEEE Journal of Solid-State Circuits, vol. 37, No. 11, Nov. 2002, pp. 1502-1509.
Ki-Tae Park et al, "A Novel NAND Flash Memory With Asymmetric S/D Structure Using Fringe-Field-Induced Inversion Layer", IEEE Transactions on Electron Devices, vol. 55, Issue 1, pp. 404-410, Jan. 1, 2008.
Lue, et al., "A Novel Junction-Free BE-SONOS NAND Flash"; Emerging Central Lab, Technology Development Center, Macronix International Co., Ltd., 2008 Symposium on VLSI Technology Digest of Technical Papers, IEEE; Jan. 2008, pp. 140-141.
Chang-Hyoun Lee et al, "Highly Scalable NAND Flash Memory with Robust Immunity to Program Disturbance Using Symmetric Inversion-Type Source and Drain Structure", 2008 Symposium on VLSI Technology Digest of Technical Papers; Jun. 2008, pp. 118-119.
Lue, et al., "A Highly Scalable 8-Layer 3D Vertical-Gate (VG) TFT NAND Flash Using Junction-Free Buried Channel BE-SONOS Device", Emerging Central Lab, Technology Development Center, Macronix Inernational Co., Ltd., 2010 Symposium on VLSI Technology Digest of Technical Papers, Jun. 2010, pp. 131-132.
Chang, et al., "Memory Architecture of 3D Vertical Gate (3DVG) NAND Flash Using Plural Island-Gate SSL Decoding Method and Study of It's Program Inhibit Characteristics", Macronix International Co., Ltd., Emerging Central Lab, Technology Development Center, Design Center, IEEE, May 2012, pp. 1-4.
Dongyean OH et al, "A New Self-Boosting Phenomenon by Soure/Drain Depletion Cut-off in NAND Flash Memory", 2007 IEEE Non-Volatile Semiconductor Memory Workshop, Aug. 2007, pp. 1-3.
IL Han Park et al, "Depletion-Enhanced Body-Isolation (DEBI) Array on SOI for Highly Scalable and Reliable NAND Flash Memories", IEEE Transactions on Nanotechnology, vol. 5, No. 3, May 2006, pp. 201-204.
Jung, T. et al, "A 117-MM2 3.3-V Only 128-MB Multilevel NAND Flash Memory for Mass Storage Applications", IEEE Journal of Solid-State Circuits, vol. 31, No. 11, Nov. 1996, pp. 1575-1583.
Hubert, et al., "A Stacked SONOS Technology, up to 4 Levels and 6nm Crystalline Nanowires, with Gate-all-around or Independent Gates (PHI-Flash), Suitable for Full 3D Integration", CEA-LETI, MINATEC, STMicroelectronics, IEEE, Dec. 2009, pp. 1-4.
Chen, et al., "A Highly Pitch Scalable 3D Vertical Gate (VG) NAND Flash Decoded by a Novel Self-Aligned Independently Controlled Double Gate (IDG) String Select Transistor (SSL)", Emerging Central Lab, Technology Development Center, Macronix International Co., Ltd., 2012 Symposium on VLSI Technology Digest of Technical Papers, Jun. 2012, pp. 91-92.
Chen, et al., "A Highly Scalable 8-layer Vertical Gate 3D NAND with Split-page Bit Line Layout and Efficient Binary-sum MiLC (Minimal Incremental Layer Cost) Staircase Contacts", Macronix International Co., Ltd., IEEE, Dec. 2012, pp. 1-4.
Hung, et al., "Design Innovations to Optimize the 3D Stackable Vertical Gate (VG) NAND Flash", Macronix International Co., Ltd., IEEE, Dec. 2012, pp. 1-4.
Hyun-Jin Cho et al, "Modeling of Surrounding Gate MOSFETs With Bulk Trap States", IEEE Transactions on Electron Devices, vol. 54, No. 1, Jan. 2007, pp. 166-169.
Andrew Walker, "Sub-50-nm Dual-Gate Thin-Film Transistors for Monolithic 3-D Flash",IEEE Transactions on Electron Devices, vol. 56, No. 11, Nov. 2009 , pp. 2703-2710, IEEE 2000.
Meikei Ieong et al, "DC and AC Performance Analysis of 25 nm Symmetric/Asymmetric Double-Gate, Back-Gate and Bulk CMOS", 2000 Simulation of Semiconductor Processes and Devices, Sep. 2000, pp. 147-150.
Hiroshi Nakamura et al, "A Novel Sense Amplifier for Flexible Voltage Operation NAND Flash Memories", 1995 Symposium on VLSI Circuits Digest of Technical Papers, Jun. 1995, pp. 71-72.
L. Crippa et al, "Nonvolatile Memories: NOR vs. NAND Architectures", Memories in Wireless Systems, Aug. 2008, pp. 29-53.

* cited by examiner

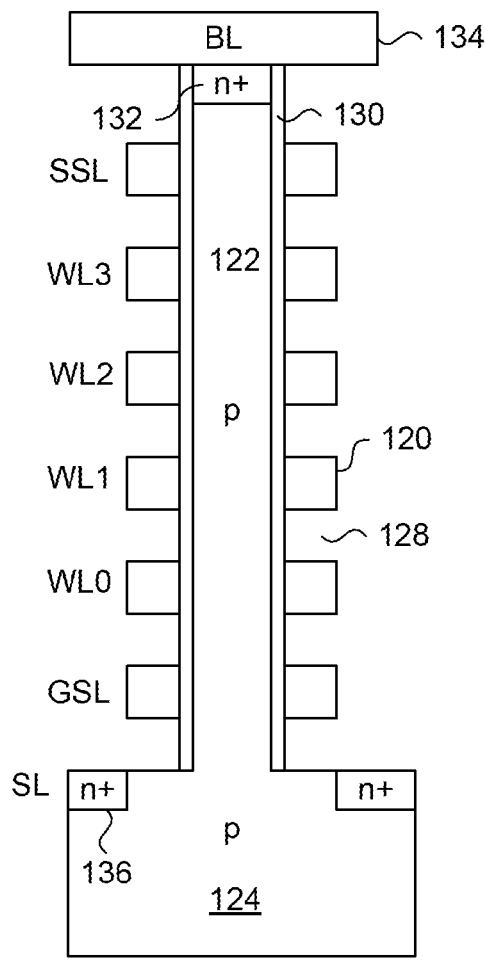
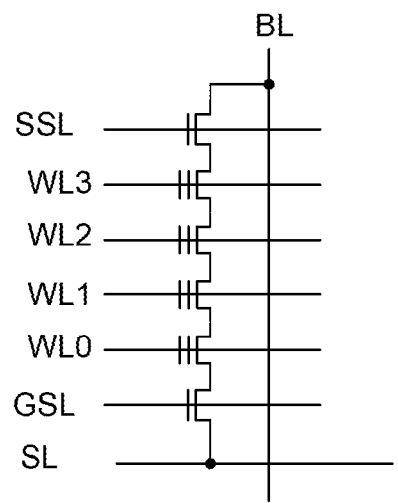
FIG. 7A
FIG. 7B

NONVOLATILE MEMORY WITH SPLIT SUBSTRATE SELECT GATES AND HIERARCHICAL BITLINE CONFIGURATION

CROSS REFERENCE TO RELATED APPLICATIONS

This application claims the benefit of priority of U.S. Provisional Patent Appln No. 61/750,955 filed on Jan. 10, 2013, which is incorporated herein by reference in its entirety.

FIELD

The present disclosure relates generally to semiconductor memory devices. More particularly, the present disclosure relates to non-volatile memory devices.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

Flash memory is organized into blocks, which are erasable. Known flash memory devices suffer inefficiencies in cost, performance and power resulting from their erase schemes. Erasing can be power inefficient as large wells within which the memory cells of the memory blocks are fabricated, are repeatedly charged and discharged during erase and erase verify operations. Accordingly, large charge pumps are needed on-chip, which occupy chip area and thereby increases chip size and cost.

SUMMARY

In a first aspect, the present disclosure provides a non-volatile memory including at least two groups of non-volatile memory cells, local bitlines, a global bitline, and a select device corresponding to each of the at least two groups. The at least two groups of non-volatile memory cells are each eraseable in an erase operation. The local bitlines are coupled to the non-volatile memory cells of each group of the at least two groups. The select device corresponding to each of the at least two groups is configured to disconnect all the local bitlines from the global bitline. According to an embodiment of the present aspect, a body of the select device for electrically connecting a local bitline coupled to the non-volatile memory cells of one group of the at least two groups to the global bitline, is electrically isolated from bodies of the non-volatile memory cells of the one group. The non-volatile memory cells can be arranged as NAND cell strings. In this embodiment, each of the at least two groups of non-volatile memory cells are formed in corresponding pocket wells of a substrate and are electrically isolated from each other, and each of the corresponding pocket wells is connected to a local erase line for receiving an erase voltage.

In the present embodiment, the select device is formed in a region of the substrate external to the pocket wells. Furthermore, the pocket wells have a first dopant type and are formed in a well having a second dopant type, and the well is formed in the substrate having the first dopant type. The first dopant type can be p-type and the second dopant type can be n-type. In the embodiment where the select device is formed in a region of the substrate external to the pocket wells, the NAND cell strings comprise planar NAND cell strings or alternately, the NAND cell strings comprise three-dimension (3D) stacked NAND cell strings having a body with a vertical channel electrically coupled to a respective pocket well. In an alternate configuration. In that embodiment, a first select device corresponding to a first group of the at least two groups and a second select device corresponding to a second group of the at least two groups can be formed adjacent to each other in the substrate and share a single contact to the global bit line.

According to the embodiment where the non-volatile memory cells are arranged as NAND cell strings, the NAND cell strings comprise 3D stacked NAND cell strings having bodies electrically isolated from a substrate. In this present embodiment, the select device corresponding to each of the at least two groups are formed in the substrate, a source line is formed in the substrate and electrically isolates the bodies from the substrate, and the bodies have a first dopant type, the source line has a second dopant type, and the substrate has the first dopant type. The first dopant type is p-type and the second dopant type is n-type. Furthermore, each of the at least two groups can include at least two NAND memory blocks of NAND cell strings.

In the embodiment where the select device corresponding to each of the at least two groups are formed in the substrate, the source line is formed as a conductive line over the substrate, and a first select device corresponding to a first group of the at least two groups and a second select device corresponding to a second group of the at least two groups can be formed adjacent to each other in the substrate and share a single contact to the global bit line. In an embodiment of the first aspect, the select device corresponding to each of the at least two groups can include a pass transistor enabled by a local bitline select signal, and the non-volatile memory can further include row decoding circuitry configured to provide the local bitline select signal corresponding to each pass transistor for disconnecting all the local bitlines from the global bitline in an erase operation.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 7A is a cross-sectional view of an alternate vertical channel NAND cell string;

FIG. 7B shows the equivalent circuit schematic for the vertical channel NAND cell strings of FIG. 7A;

DETAILED DESCRIPTION

Figure 1A:
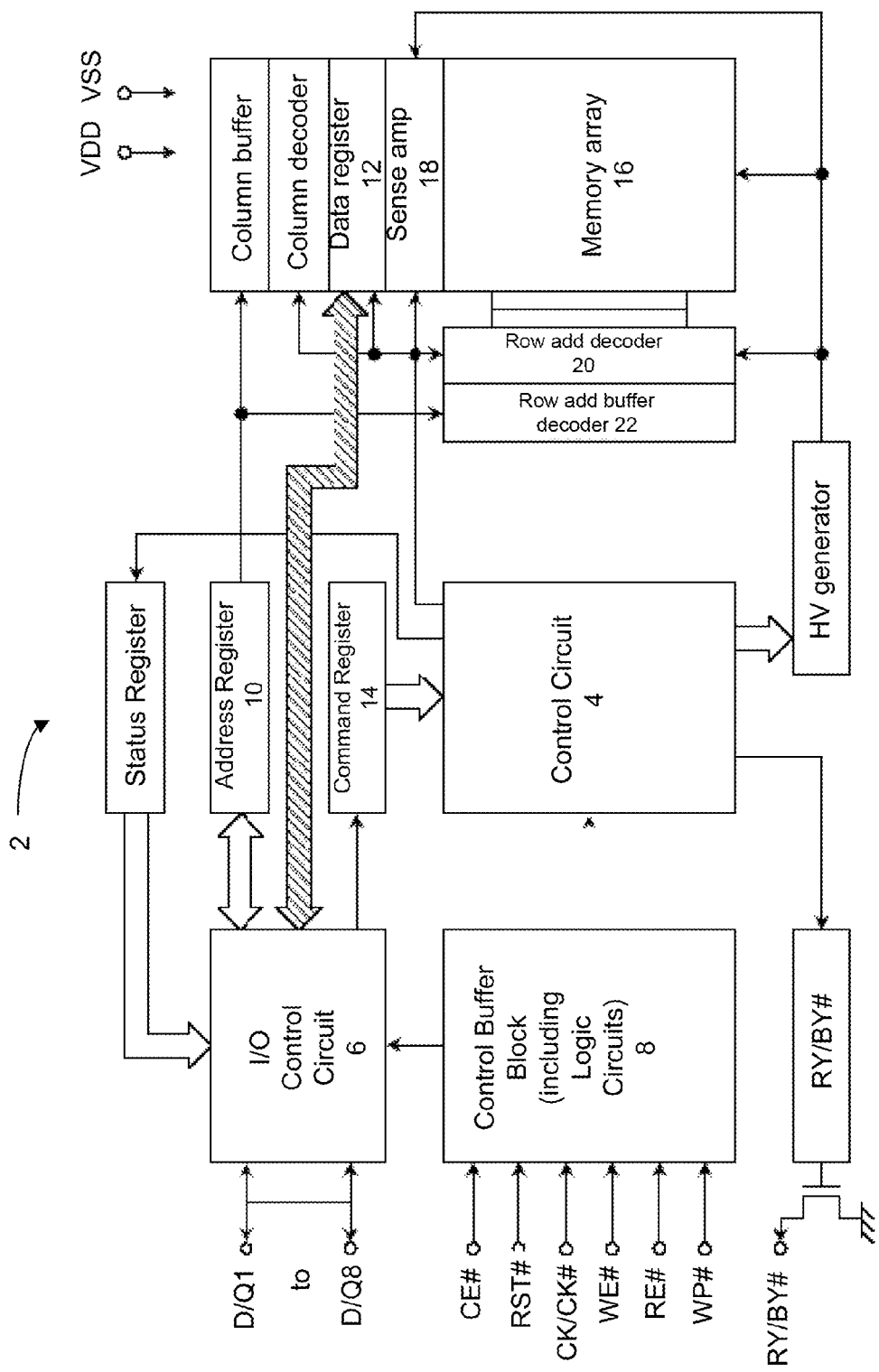
FIG. 1A is a block diagram of a flash memory device.

FIG. 1A is a general block diagram of a flash memory device which can incorporate the embodiments of the present disclosure. Flash memory 2 includes well known input and output buffer circuits, such as input/output (I/O) buffer block 6 and control buffer block 8 for receiving external control and data input signals and providing data output signals. The control buffer block 8 receives the control signals, such as CE# and WE#, may include other basic logic circuits, for implementing rudimentary functions that may be related to control of the data input and buffers for example. Flash memory 2 includes control circuit 4, for controlling various high level functions of the flash circuits such as read, program and erase operations for example, an address register 10 for storing address information, a data register 12 for storing program data information, a command register 14 for storing command data information, high voltage circuits for generating the required program and erase voltages, and core memory circuits for accessing the memory array 16. Memory array 16 includes flash memory cells, arranged as NAND cell strings for example. The NAND cell strings of a column are coupled to a bitline, which is connected to a page buffer/sense amplifier circuit 18. Sense amplifier circuit 18 senses read data from a selected page of memory cells and provides program data to a selected page of memory cells. One page of memory cells refers to all the memory cells connected to the same wordline. Driving the wordlines is row drivers/decoders, shown as a row address decoder 20 and row address buffer 22. There can be one or more hierarchical stages of decoding, and row address buffer 22 can include block decoding logic.

The control circuit 4 includes a command decoder and logic (not shown) for executing internal flash operations, such as read, program and erase functions. Those skilled in the art will understand that these operations are executed in response to the command data stored in the command register 14, sometimes in combination with the address data and program data stored in the respective address register 10 and data register 12, depending on the operation to be executed. The command data, address data and program data are issued by a memory controller and latched into the corresponding registers by flash memory 2. The functions of the shown circuit blocks of flash memory 2 are well known in the art. Persons skilled in the art will understand that flash memory 2 shown in FIG. 1A represents one possible flash memory configuration amongst many possible configurations. In FIG. 1A, memory array 16, sense amplifier circuit 18, data register 12, row address decoder 20 and row address buffer 22 are part of one memory bank.

Figure 1B:
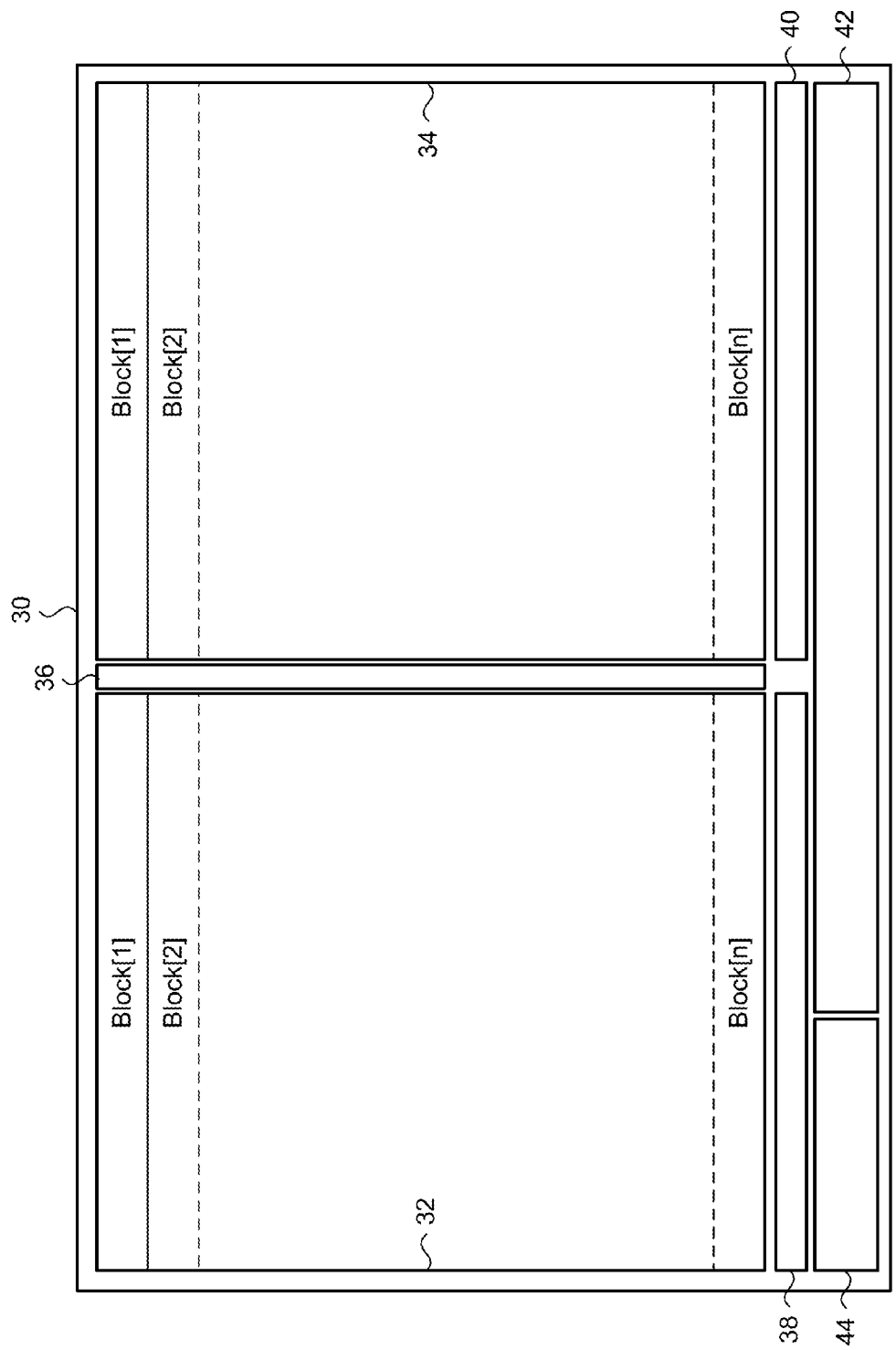
FIG. 1B is a floor plan layout a flash memory device.

FIG. 1B is a floor plan layout a prior art flash memory device to show the area occupied by various circuit blocks. Typically, all the circuit blocks shown in FIG. 1A are formed in the floor plan layout of FIG. 1B. In FIG. 1B, flash memory chip 30 is a semiconductor material rectangular in shape, upon which are formed transistor circuits and structures. Occupying a large proportion of the area are two memory arrays or memory tiles, 32 and 34, which generally correspond to memory array 16 of FIG. 1A. While the present example flash memory 30 includes two memory arrays, alternative designs can include a single memory array or more than two memory arrays. Located between memory arrays 32 and 34 are row decoders 36 that drive wordlines to the required voltage level for read, program and erase operations. Row decoders 36 generally correspond to row address decoder 20 and row address buffer 22 of FIG. 1A. In the example of FIG. 1B, wordlines (not shown) extend in a horizontal direction. Located below each of memory arrays 32 and 34 are page buffers 38 and 40, each being electrically connected to bitlines (not shown) for providing program data and for sensing read data. Page buffers 38 and 40 generally correspond to data register 12 and sense amplifier 18 of FIG. 1A. The page buffers 38 and 40 receive and provide data via data lines (not shown), which are coupled to the input and output (I/O) circuits in logic block 42. Logic block 42 further includes other circuits such as a command decoder and registers. Another large area is dedicated for at least one charge pump 44, which is responsible for generating high voltages required for programming and erasing data stored in the flash memory cells of the first memory array 32 and the second memory array 34. Charge pump 44 generally corresponds to the high voltage generator of FIG. 1A. The elements of flash memory chip 30 have been generically described, but persons skilled in the art will understand that each of the outlined blocks of FIG. 1B will include all the circuits necessary to achieve proper operation of flash memory chip 30.

In the presently shown example of FIG. 1B, the flash memory chip 30 is designed to have non-volatile memory cells arranged in NAND cell strings within memory arrays 32 and 34. The NAND cell strings are organized into memory blocks, such as Block[1] to Block[n], where n can be any non-zero integer value representing a last memory block. The selection of the number of blocks in each array is a design parameter of flash memory chip 30.

Figure 2:
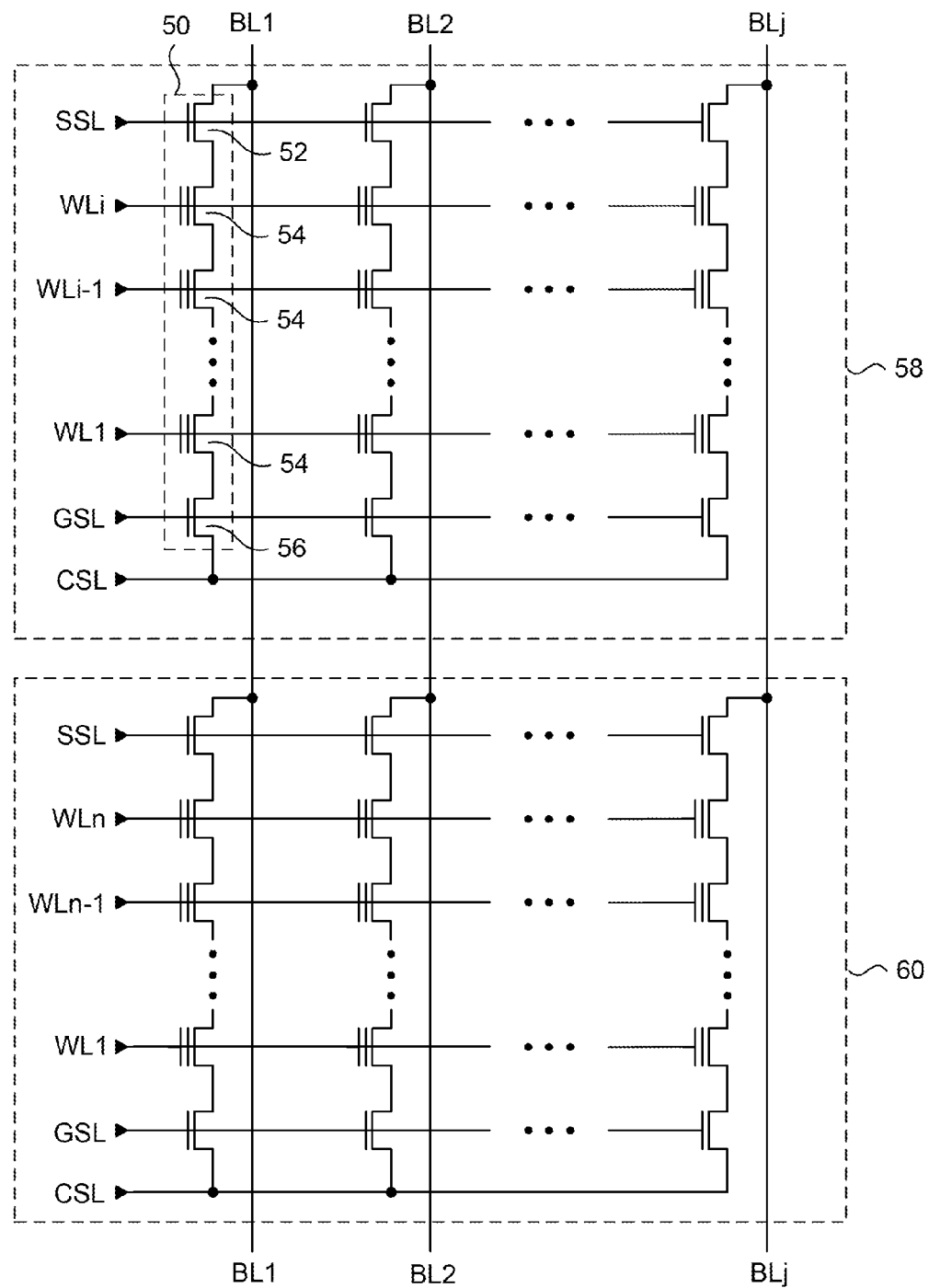
FIG. 2 is a circuit schematic showing circuit details of two memory blocks in one memory array of the flash memory device of FIG. 1B.

FIG. 2 depicts an example memory array of flash memory chip 30 of FIG. 1B. The example illustrated in FIG. 2 has two memory blocks in one memory array. In FIG. 2, one NAND cell string is outlined with a dashed box 50, which includes a string select device 52, flash memory cells 54, and a source line select device 56 connected in series between bitline BL1 and common source line CSL. There can be "i" flash memory cells 54 per NAND cell string, where "i" is a non-zero integer value indicating the last wordline of the cell string. Accordingly, wordlines WL1 to WLi are electrically coupled to corresponding gates of the flash memory cells 54, where i can be any non-zero integer value representing a last wordline of the string. A string select line (SSL) and a source select line (GSL) are electrically coupled to select devices 52 and 56 respectively. In the present example, all the transistors of the NAND cell string 50 are n-channel devices.

A memory block 58, being the same as memory Block[1] of FIG. 1B for example, includes all the NAND cell strings having select devices and flash memory cells connected to the same wordlines, string select line and source select line. The width of memory block 58 is set by the number of bitlines, which in the case of FIG. 2 is "j" bitlines where j is a non-zero integer value representing a last bitline of the memory array. Memory block 60 includes further NAND cell strings connected to bitlines BL1 to BLj. A bitline and the NAND cell strings electrically connected to it is referred to as a column.

All the circuits of flash memory chip 30 of FIG. 1B, including the NAND cell strings shown in FIG. 2 are formed by using well-known semiconductor manufacturing processes. In such processes, transistors of the same type are grouped together and formed in their own well. For example, n-type transistors are formed in a p-type well and p-type transistors are formed in an n-type well. In some cases, only a single well is used, where its type depends on the type of the substrate. In most NAND flash memory devices, all the NAND cell strings of the memory blocks of the memory array are formed in one well.

Figure 3:
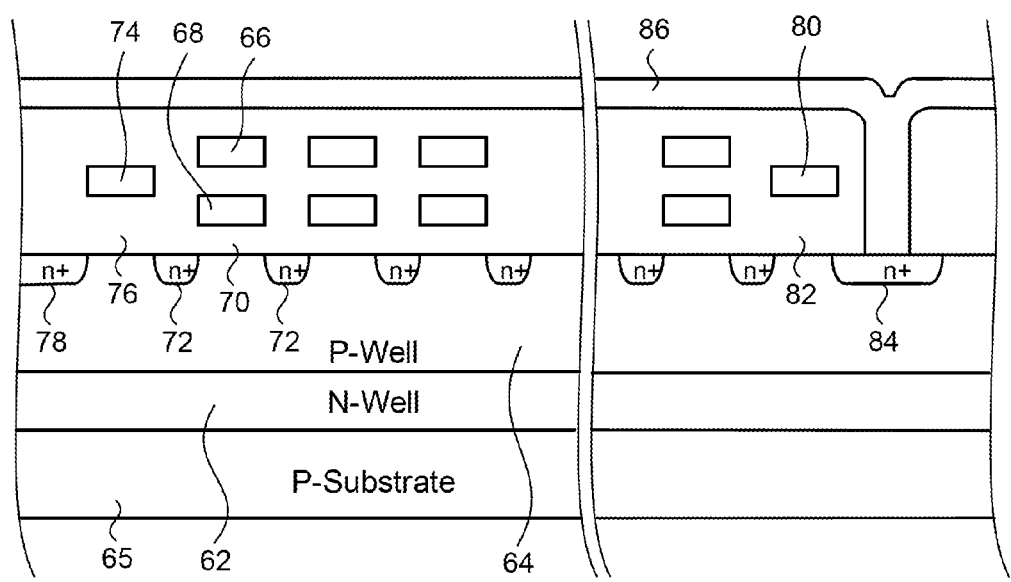
FIG. 3 is a cross section diagram of a planar type NAND cell string.

FIG. 3 is a cross section diagram of a NAND cell string 50, in particular a planar type NAND cell string having the equivalent circuit diagram shown in FIG. 2. Each flash memory cell includes a polysilicon wordline 66 and a polysilicon floating gate 68, where the floating gate 68 is formed over a thin gate oxide 70. On either side of thin gate oxide 70 and formed within p-type well 64 are n-type diffusion regions 72. The p-type well 64 is formed in an n-type well 62, which itself is formed in the p-type substrate 65. The source line select device 56 includes a polysilicon gate 74 formed over a thick gate oxide 76, and an n-type diffusion region 78 acting as the common source line CSL. Diffusion region 78 is shared with all the NAND cell strings in the memory block, as illustrated in FIG. 2. The string select device 52 includes a polysilicon gate 80 formed over a thick gate oxide 82, and an n-type diffusion region 84 that is electrically connected to a bitline 86.

As is well known in the art, NAND flash memory devices are block erasable, meaning that individual memory blocks can be selectively erased through Fowler-Nordheim (F-N) tunneling, based on a block address or other selection signal. In order to erase a memory block such as memory block 58 of FIG. 2, the wordlines of the selected memory block are biased to 0V, SSL and GSL are floated, and both the n-well 62 and the p-well 64 formed within the substrate 65 are biased to Verase. Verase is a high voltage generated by a charge pump, and in example flash memory devices can be about 20V. Because SSL and GSL are floated during the erase operation, both SSL and GSL are self-boosted when Verase is applied to n-well 62 and p-well 64 due to the capacitive coupling between the wells and SSL and GSL. Depending on the capacitive coupling ratio, GSL and SSL can be boosted to approximately 80% to 90% of Verase. CSL and all bitlines are floated during the erase operation, and eventually self-boost to about Verase-0.6V. Those skilled in the art will understand that the forward bias p-n junction voltage drop across p-well 64 to the n-type diffusion regions 78 and 84. Under these erase bias conditions, trapped electrons (charge) in the floating gate of the flash memory cells are emitted uniformly to the substrate. The threshold voltage (Vth) of the erased flash memory cell in this example becomes negative, meaning that the erased cell will turn on with a gate bias of 0V.

Since unselected memory blocks may reside in the same p-well 64 as the selected memory block, these unselected memory blocks must be inhibited from being erased. A self-boosting erase inhibit scheme described in U.S. Pat. No. 5,473,563 is widely used in NAND flash memory devices to prevent erasure of unselected memory blocks. To prevent erasure of flash memory cells in unselected memory blocks using the self-boosting erase inhibit scheme, all wordlines in unselected memory blocks are floated. Therefore floated wordlines in the unselected memory blocks are boosted to about 90% of Verase when the p-well 64 rises to Verase, by capacitive coupling between the p-well 64 and the wordlines. It should be understood that the final boosted voltage level on the floating wordlines is determined by the coupling ratio between the substrate and wordlines. The boosted voltage of the wordlines in the unselected memory blocks is effective for reducing the electric field between the p-well 64 and the wordlines, thereby minimizing unintended erasure of data stored therein.

Figure 4:
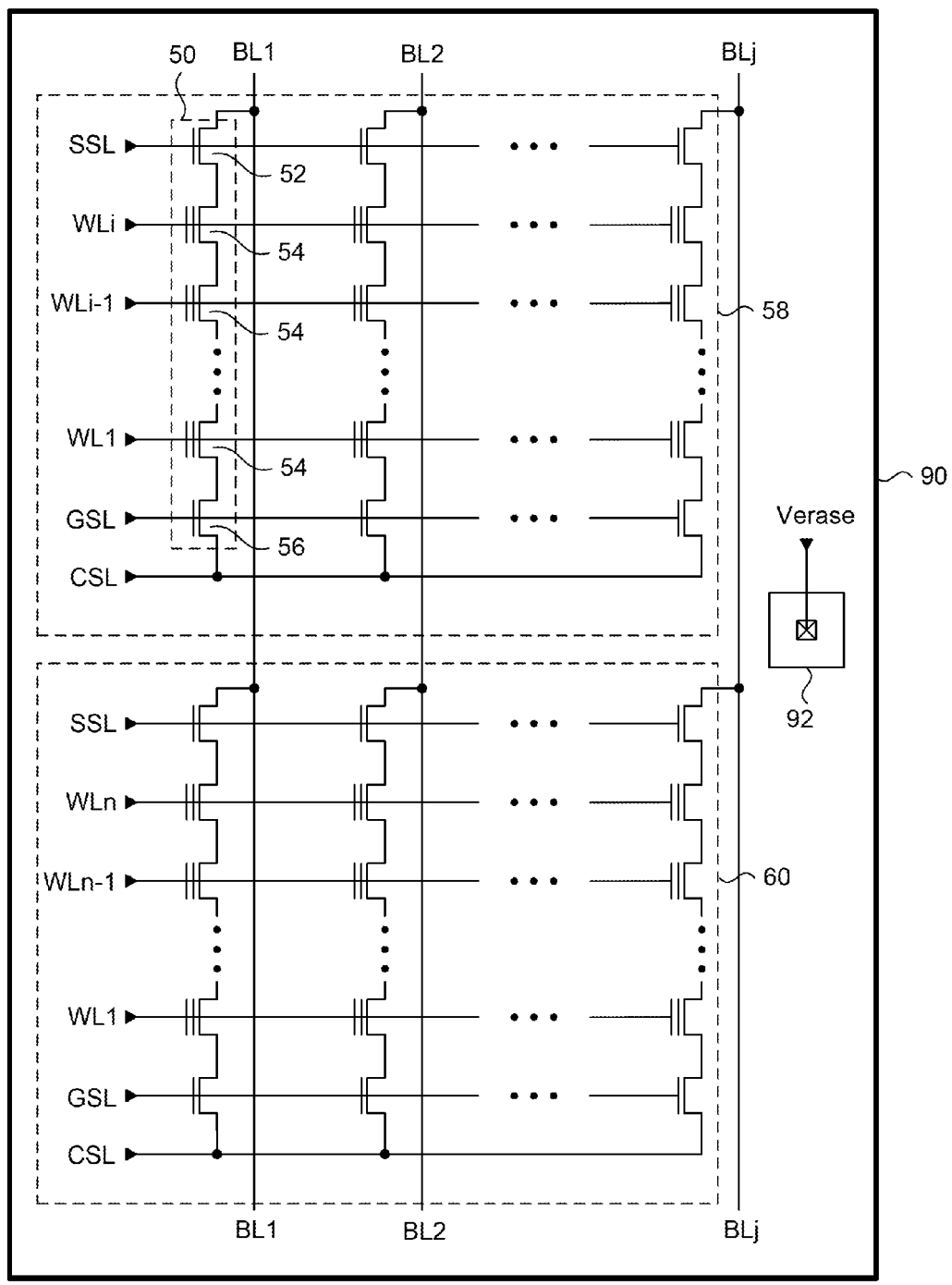
FIG. 4 is a circuit schematic of the memory blocks of FIG. 2 formed in the same well.

FIG. 4 is a circuit schematic of the memory blocks of FIG. 2 formed in the same P-well, also referred to as a pocket well 90, to facilitate an understanding of how unselected memory blocks are inhibited from being erased. Only two memory blocks 58 and 60 are shown in the example of FIG. 4, but those skilled in the art understand that any number of memory blocks can be included within the boundaries of pocket well 90. Also shown in FIG. 4 is a contact area 92 for receiving erase voltage Verase. With the bias conditions shown in Table 1 below, the memory cells of selected memory block 58 is erased and the memory cells of the unselected memory block 60 is inhibited. Although the memory cells of unselected memory block 60 are formed in the same pocket well 90 as those of selected memory block 58, they are inhibited from being erased as their wordlines are boosted to close to Verase due to capacitive coupling with the substrate.

TABLE 1

|  | Selected Block 58 | Unselected Block 60 |
| --- | --- | --- |
| Bitlines (BL) | Clamped to V_erase-0.6 V | Clamped to V_erase-0.6 V |
| String Select | Boosted to approx. 90% of | Boosted to approx. 90% of |

TABLE 1-continued

|  | Selected Block 58 | Unselected Block 60 |
| --- | --- | --- |
| Line (SSL) | V_erase | V_erase |
| Wordlines (WL0~WL15) | 0 V | Boosted to approx. 90% of V_erase |
| Ground Select Line (GSL) | Boosted to approx. 90% of V_erase | Boosted to approx. 90% of V_erase |
| Source Line (SL) | Clamped to V_erase-0.6 V | Clamped to V_erase-0.6 V |
| Cell body | V_erase | V_erase |

One solution to address the problems noted above is to fabricate a non-volatile memory device with at least one memory block formed in different pocket wells. Each pocket well can include for example a device well within which the NAND cell strings of the memory block(s) are formed in, and isolation wells for isolating the substrate from the device wells. Hence, at least one memory block is electrically isolated from another memory block. At least one pocket well is selectively coupled to an erase voltage during an erase operation, such that unselected pocket wells are inhibited from receiving the erase voltage, thereby minimizing erase disturb in the unselected pocket wells. Because each pocket well has a small area relative to a single well that includes all memory banks, the capacitance of each pocket well is small. This results in several advantages such as higher speed erasing or reduced charge pump size. Commonly owned US Patent Publication 20110170352 describes this technique of dividing the cell array into multiple pocket wells, each of which includes at least one memory block and receives an erase voltage.

Figure 5:
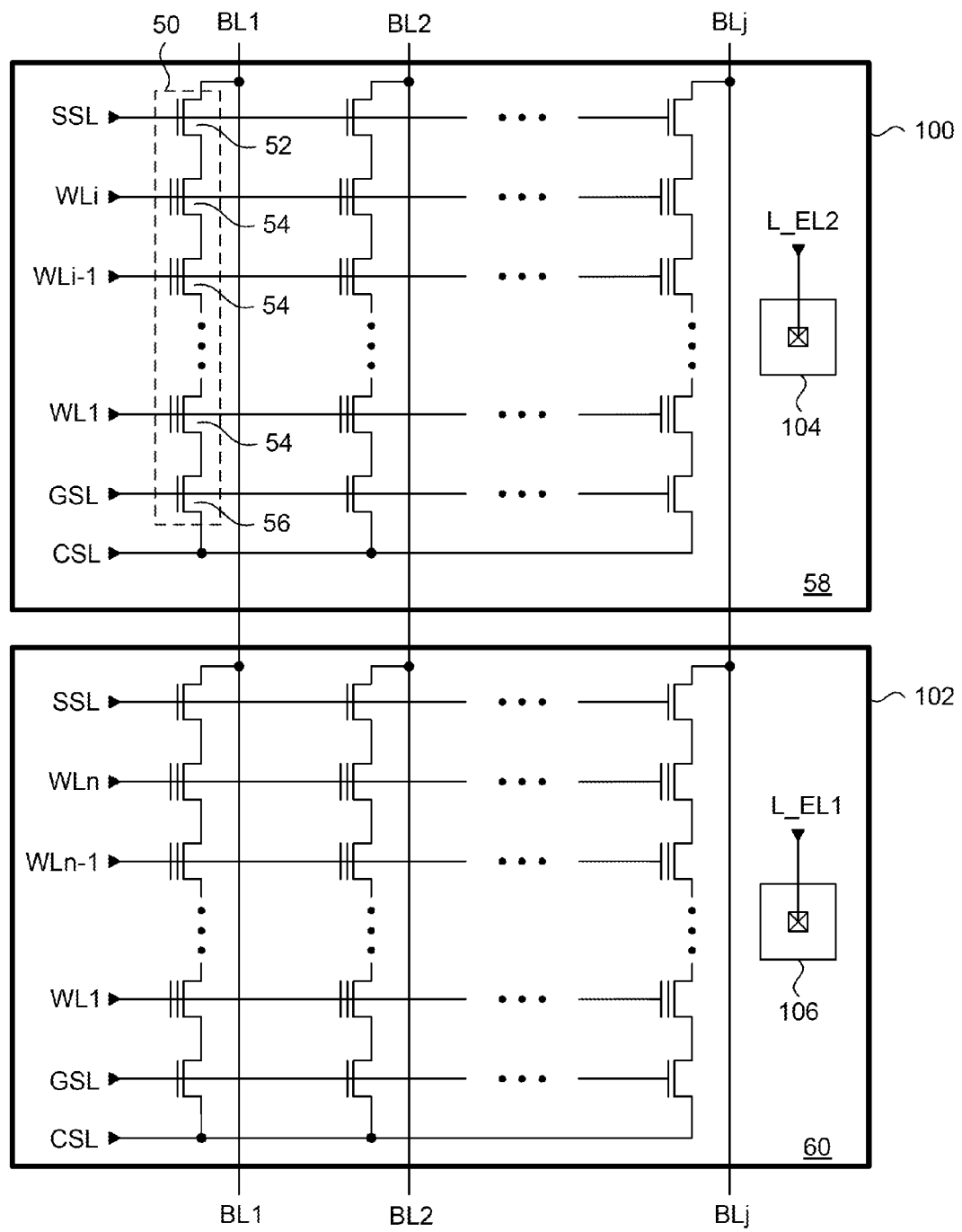
FIG. 5 is a circuit schematic of the memory blocks of FIG. 2 formed in their own wells.

FIG. 5 shows the memory blocks of FIG. 2 each formed in respective pocket wells having dedicated erase voltage connections formed therein. In FIG. 5, the NAND cell strings 50 of memory block 58 are formed within a pocket well delineated by box 100 while the NAND cell strings 50 of memory block 60 are formed within a pocket well delineated by box 102. Pocket wells 100 and 102 are electrically isolated from each other. Assuming in the present example that the pocket well is a pocket P-well, a P+ region 104 is formed as a contact region for connection to a local erase line L_EL2 that provides an erase voltage to memory block 58. Similarly, a P+ region 106 is formed for connection to a different local erase line L_EL1 that provides an erase voltage to memory block 60. Local erase lines L_EL1 and L_EL2 are selectively applied to their respective memory blocks based on a block address, but both carry the same erase voltage V_ERASE, thereby allowing individual memory blocks to be erased. Each pocket well 100 and 102 can be sized to include more than one memory block.

The NAND cell strings shown in FIG. 3, FIG. 4 and FIG. 5 are planar NAND cell strings, as they are fabricated in the semiconductor substrate of the memory device. In other words, the memory cells are arranged in the substrate along the x axis and y axis of the plane. To increase the overall density of the memory array, NAND cells are formed in three-dimensions (3D). More specifically, the memory cells are stacked in the z axis, in addition to being arranged in the x-y plane.

Figures 6A, 6B:
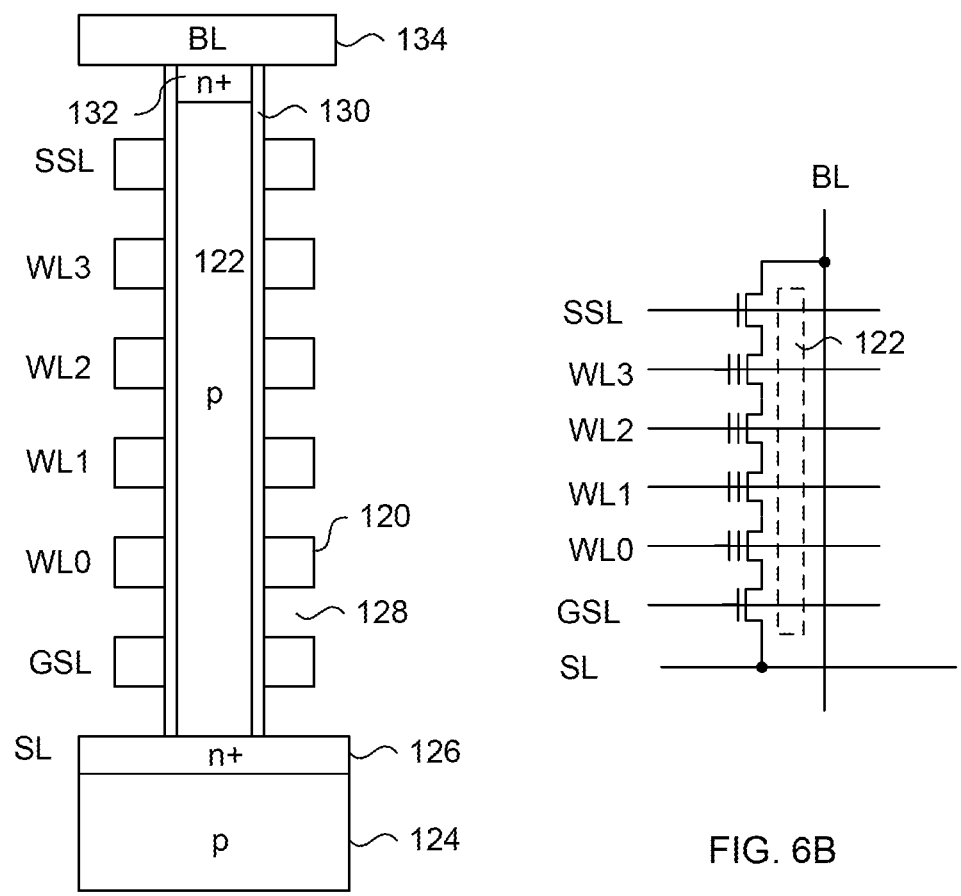
FIG. 6A is a cross-sectional view of a vertical channel NAND cell string.
FIG. 6B shows the equivalent circuit schematic for the vertical channel NAND cell strings of FIG. 6A.

A first type of 3D stacked NAND cell string is the vertical channel NAND cell string. FIG. 6A is a cross-sectional view of a vertical channel NAND cell string where gates 120 of the memory cells, the SSL and GSL transistors wrap around vertically aligned bodies 122, thus forming a gate-all-around structure. In the given examples as well as throughout the description, it is assumed that NAND cell transistors consist of n-channel transistors on p-type (or undoped) substrate. However, the NAND cell transistors can be p-channel transistors formed on n-type substrate, or the substrate may consist of undoped silicon. In the present example of FIG. 6A, the body is p-type, and is isolated from the p-type cell substrate or p-type well 124 by an n+ type diffusion layer 126 which forms the source line (SL) of the cell strings. Erasing of the memory cells is achieved by injecting holes into the body 122 through gate induced drain leakage (GIDL) current by biasing the source line (SL) at an appropriate erase voltage level. The GIDL mechanism is well known in the art. The space 128 between the gates 120 is filled with dielectric material. A type of gate dielectric 130 is formed between the gates 120 and the bodies 122. Another n+ diffusion layer 132 is formed at the top portion of the body 122 for making electrical contact with a bitline (BL) 134. FIG. 6B shows the equivalent circuit schematic for the vertical channel NAND cell string shown in FIG. 6A. It is noted that a rectangular box is shown in FIG. 6B to represent the isolated body 122 of FIG. 6A. Alternately, the body can be n-type.

Another type of vertical channel NAND cell string is shown in the cross-sectional view of FIG. 7A. The vertical channel NAND cell string of FIG. 7A is similar to the one shown in FIG. 6A, hence the reference numbers appearing in FIG. 7A refer to the same numbered features for FIG. 6A. The main difference of the vertical channel NAND cell string of FIG. 7A over the vertical channel NAND string of FIG. 6A is that the p-type body 122 is connected to the p-type cell substrate or p-type well 124 without any junction in between. The NAND cell string thus has an opening at the bottom where the body 122 and substrate 124, which are of the same impurity type, are electrically connected with each other continuously through the same doping type. An n+ diffusion region 136 is formed in the substrate 124 which functions as the source line SL for the vertical channel NAND cell string. Because the body 122 of the vertical channel NAND cell string is electrically connected to the substrate 124, erasing is done in the same manner as previously explained for the NAND cell strings of FIG. 5. It is noted that the erase voltage may be applied at multiple contact points of the substrate 124 for distributing the erase voltage. Accordingly, the vertical channel NAND cell string of FIG. 7A is erased simply by biasing the substrate 124 to the erase voltage Verase. FIG. 7B shows the equivalent circuit schematic for the vertical channel NAND cell string shown in FIG. 7A.

Figure 8:
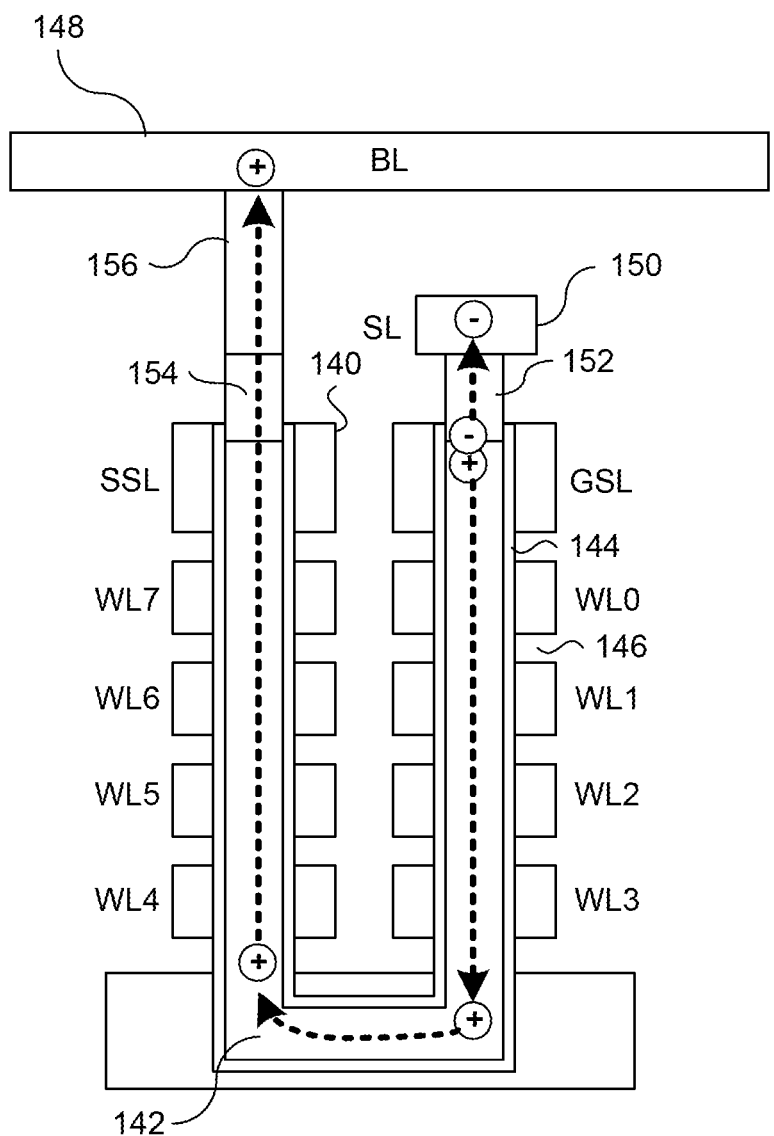
FIG. 8 is a cross-section view of a bent pipe NAND cell string.

A second type of 3D stacked NAND cell string is pipe NAND cell string shown in the cross-sectional view of FIG. 8. The pipe NAND cell string of FIG. 8 includes gates 140 similar to gates 120 of FIGS. 6A and 7A, which wrap around the body 142 via a gate dielectric 144. The space between gates 140 are filled with insulating dielectric 146. The pipe NAND cell string is similar to the ones shown in FIGS. 6A and 7A, except that the string is bent in a U-shape so that the string select (SSL) transistors as well as the ground select (GSL) transistors are located above the memory cells receiving wordlines WL0 to WL7, and the bitline 148 and the source line 150 are located above all transistor devices of the cell string. In the presently shown example of FIG. 8, n+ diffusion layer 152 electrically couples source line 150 to the GSL transistor, while n+ diffusion layer 154 electrically couples the bitline 148 to the SSL transistor via metal contact 156. The pipe NAND cell string is erased through the GIDL mechanism.

FIGS. 6A, 7A and 8 are examples of vertical channel NAND cell strings, which the NAND cells are arranged such that the channel of the NAND cell string extends in the generally vertical direction from the surface of the substrate. As shown in the example of FIG. 8, the vertical channel can have portions which are orthogonal to the substrate surface and portions which are parallel to the substrate surface. Hence a vertical channel NAND cell string can include at least one portion that extends in a direction orthogonal or substantially vertical to the plane of the semiconductor substrate.

As previously mentioned, a memory block of NAND cell strings can be selectively erased. For planar NAND cell strings, this is done by biasing a pocket well containing the memory block to an erase voltage. For the vertical 3D NAND cell strings, this is done by biasing a source line connected to a memory block to an erase voltage. However, the problem remains that all bitlines will charge to a voltage close to the erase voltage Verase even when a specific memory block receives the erase voltage. This occurs because the positively biased cell bodies are connected to the bitlines through the forward biased pn junctions from the cell body to the drain of the string select transistors. Because bitlines are connected to all the memory blocks, it is possible that the cell bodies of the unselected memory blocks will charge.

Figure 9:
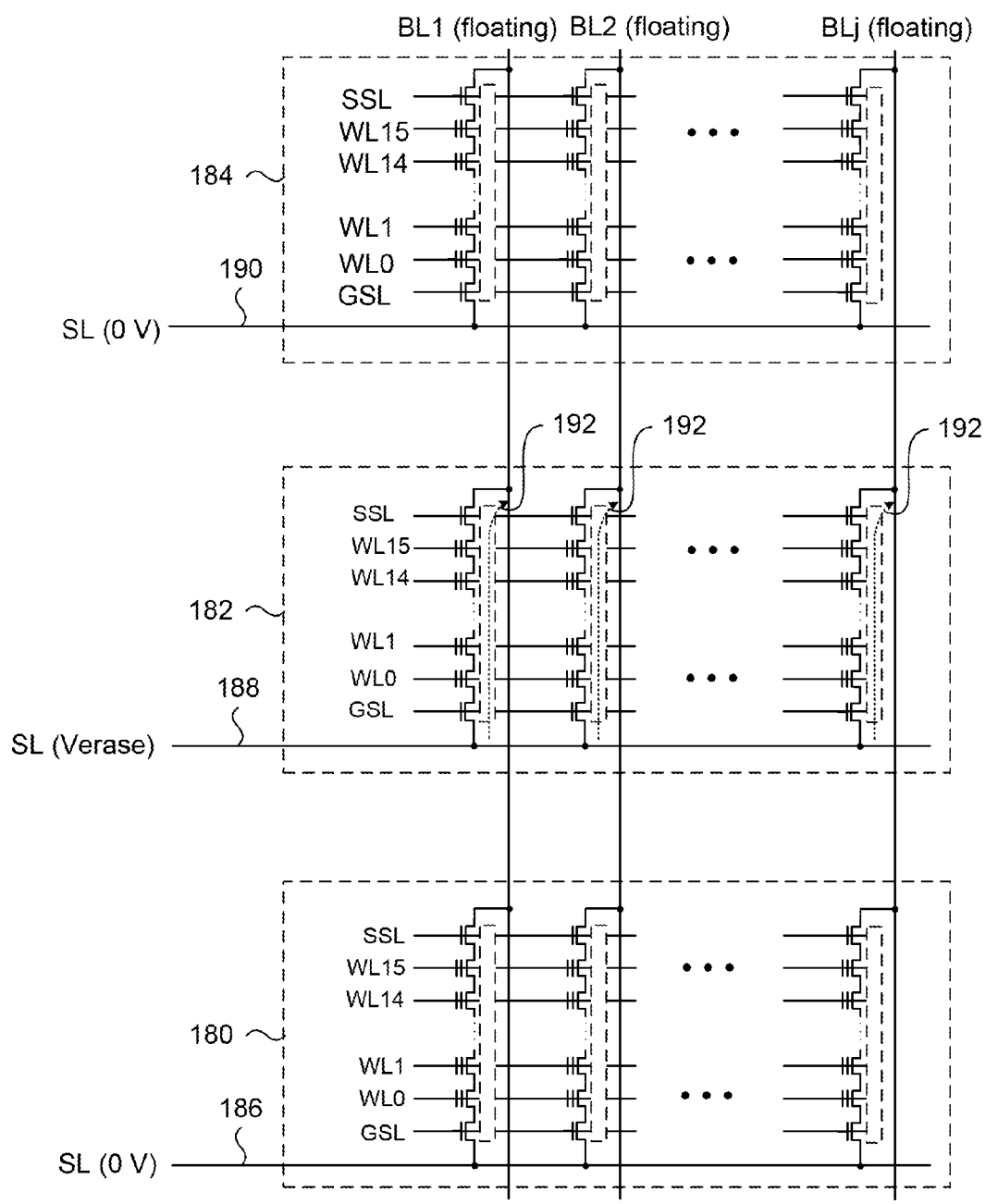
FIG. 9 is a circuit schematic of NAND cell strings showing current leakage into bitlines.

An example of this effect is illustrated in the circuit schematic of FIG. 9, which shows memory blocks of vertical channel NAND cell strings similar to those shown in FIG. 6A. It is assumed for this example that the erase voltage is supplied by the source lines SL and the cell bodies are charged via GIDL current. It is further assumed in this example that the source lines are decoded such as to provide erase voltages only to selected blocks during erase operation. Accordingly, the bias conditions are shown in Table 2 below.

|  | Selected Block | Unselected Block |
| --- | --- | --- |
| Bitlines (BL) | Clamped to V_erase-0.6 V |  |
| String Select Line (SSL) | Boosted to approx. 90% of V_erase | Floating |
| Wordlines (WL0~WL15) | 0 V | Floating |
| Ground Select Line (GSL) | Boosted to approx. 90% of Verase | Floating |
| Source Line (SL) | Verase | 0 V |

FIG. 9 shows three memory blocks 180, 182 and 184, each having the aforementioned vertical channel NAND cell strings. As shown in FIG. 9, vertical channel NAND strings of the same column in memory block are connected to the same bitlines, and the vertical channel NAND strings of the same memory block are connected to the same source line, such as source lines 186, 188 and 190. In the present example, memory block 182 is the selected block for erasure, hence the row signals are biased as shown in the "Selected Block" column of Table 2. Accordingly, memory blocks 180 and 184 are unselected memory blocks, and thus have the row signal biasing shown in the "Unselected Block" column of Table 2. As SL 188 is biased to Verase, the cell bodies of the vertical channel NAND strings are charged due to GIDL current. Hence the memory cells of memory block 182 are erased. However, the GIDL current passes into the bitlines BL1 and BL2 to BLj as shown by arrows 192. Then it is possible that these bitlines charge the cell bodies of vertical channel NAND cell strings of the unselected memory blocks 180 and 184 through bitlines BL1 and BL2 to BLj. Therefore, power consumption of the memory device increases since current is distributed to other parts of the memory array.

A similar problem occurs if the memory blocks of FIG. 9 used the vertical channel NAND cell strings of FIG. 7A, or planar NAND cell strings of FIG. 3. Following is a brief discussion of a similar effect if the memory blocks of FIG. 9 uses the pipe NAND cell string of FIG. 8, with reference to the pipe NAND cell string of FIG. 8.

It is assumed in this example that the source line SL is biased at the erase voltage Verase and the cell body is charged through a GIDL current generated at the GSL transistor of each cell string. As is the case for conventional erase schemes the floating bitlines are charged through the forward biased p-n junctions between the cell body 142 and the drain of the SSL transistor. The bitline is charged up to the point where the bitline bias reaches V(cell body)−V(built in), i.e. up to the point where the voltage difference between the cell body and the bitline reaches the built-in potential of the p-n junction of the SSL transistor. For this cell structure an additional adverse effect can occur. As the bitlines get highly positively biased and the junctions between the drains of the SSL transistors and the cell bodies of unselected blocks are strongly reverse biased, GIDL current may occur between the bitlines and the cell bodies of cell blocks that are not to be erased if the string select transistors in these blocks are turned off. The charge then flows from the bitlines to connected cell bodies which belong to unselected blocks which are not to be erased, eventually resulting in charging of all cell bodies. For this reason schemes have been proposed whereby the SSL transistors are left in a turned-on state to avoid this reverse GIDL current. As a trade-off, these schemes are more vulnerable to leakage from the bitline through the channel of the cell strings.

Erase schemes which rely on the charging of the cell bodies through GIDL are especially vulnerable to any kind of leakage from the positively charged cell bodies, due to the low efficiency of the electron-hole pair creation and thus the low amount of generated GIDL current. The GIDL current of a cell string can be only 3 orders of magnitude (or less) larger than the normal turn-off condition of cell strings without GIDL. This means that the described leakage scenarios may completely cancel the desired effect of reduction in power consumption, and lead to a considerable increase of the time it takes to charge the cell bodies or even completely deteriorate the erase bias of the cell bodies.

Figure 10A:
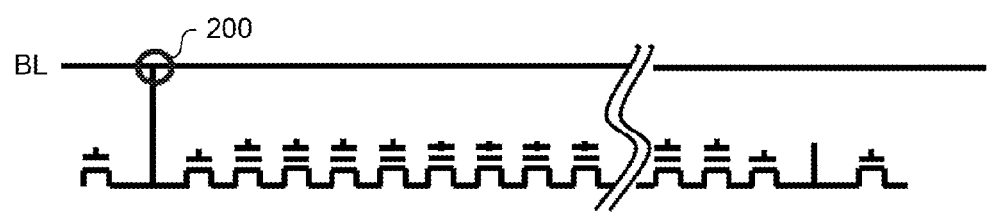
FIG. 10A is an illustration of a planar NAND cell string connected to a bitline.
Figure 10B:
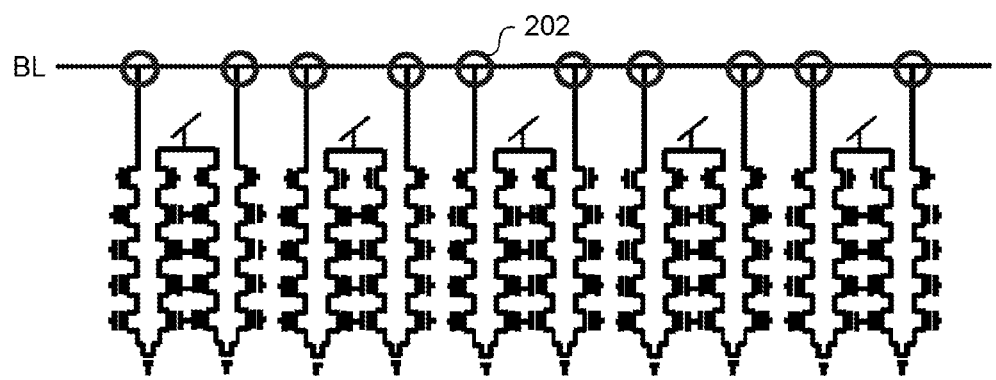
FIG. 10B is an illustration of three-dimension (3D) NAND cell strings connected to a bitline.

Bitline leakage is another problem that is more prevalent with memory blocks consisting of vertically stacked NAND cell strings. FIG. 10A is an illustration of a planar NAND cell string connected to a bitline via bitline contact 200. FIG. 10B is an illustration of pipe NAND cell strings connected to a bitline. Assuming that the same technology node is used for fabricating the NAND cell strings of FIGS. 10A and 10B, it can be seen that there is a much greater number of NAND cell strings and corresponding bitline contacts 202 per bitline in FIG. 10B. NAND Flash memories with vertically stacked cells are generally more vulnerable to bit line leakage during read operations due to the large number of strings and bit line contacts per bitline as compared to planar NAND cell strings. To combat current leakage, it has been proposed to turn on the SSL transistors connected to the bitline so that no reverse GIDL current from the bitlines to the cell bodies occurs at unselected NAND cell strings. However as stated before, channel leakage from the charged bitlines through the NAND cell strings in the entire array may still occur. In the worst case where cells of unselected strings are all in an erased state (on state), the GSL transistors are relied upon to prevent leakage from the bitlines through the NAND cell strings.

According to an embodiment of the disclosure, the problem of wasted power consumption due to charging of unselected cell bodies during erase operations, and current leakage during read operations is addressed by a hierarchical bitline arrangement of the memory array. Generally, the present disclosure provides a non-volatile memory device having a hierarchical bitline configuration for preventing erase voltages applied to one group of memory cells of the memory array from leaking to other groups in which erasure is not required. Local bitlines are coupled to the memory cells of each group of memory cells. Each local bitline can be selectively connected to a global bitline during read operations for the selected group, and all the local bitlines can be disconnected from the global bitline during an erase operation when a specific group is selected for erasure of one or more memory blocks. Select devices for electrically connecting each bitline of a specific group of memory cells to the global bitline have device bodies that are electrically isolated from the bodies of those memory cells.

Figure 11:
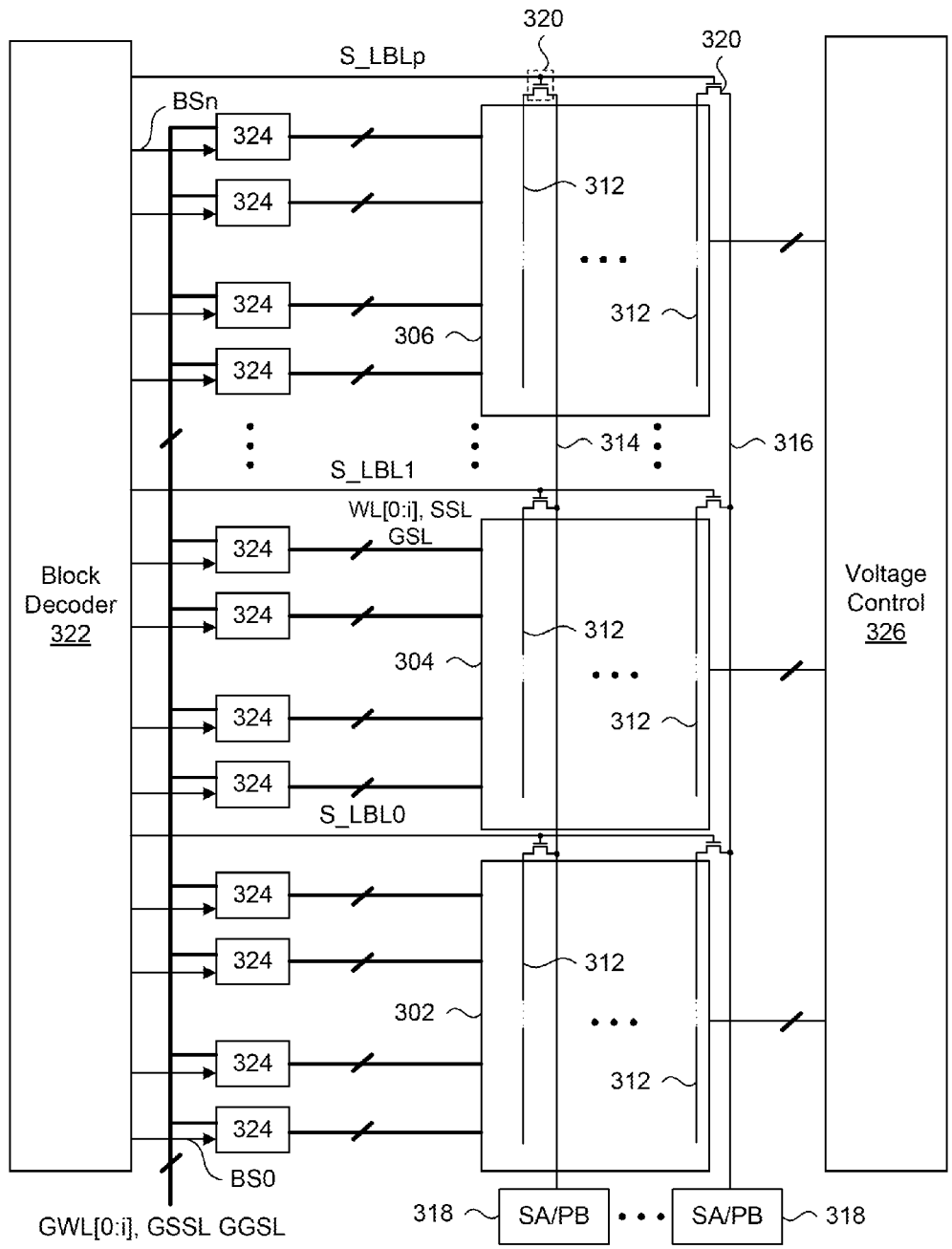
FIG. 11 is a block diagram of a non-volatile memory array having a hierarchical bitline configuration, according to an embodiment of the present disclosure

FIG. 11 is a block diagram of a non-volatile memory array having a hierarchical bitline configuration, according to an embodiment of the present disclosure. According to the present embodiment, select devices are provided for electrically connecting each bitline of a specific group of memory cells to a global bitline, where the select devices have device bodies that are electrically isolated from the bodies of those memory cells. The memory array includes a plurality of memory blocks (not shown) organized into groups, referred to super blocks, such as super blocks 302, 304 and 306. As will be shown later, each super block includes a predetermined number of memory blocks, and each memory block includes NAND cell strings such as those previously shown in FIGS. 5, 6A, 7A and 8 by example. The NAND cell strings of a column in each super block are connected to a respective local bitline 312, one of which is annotated in super block 306. All the local bitlines of a column are selectively coupled to a global bitline. In FIG. 11, a first global bitline 314 and a last global bitline 316 are shown. Each global bitline is connected to a sense amplifier/page buffer circuit 318 for sensing data and for providing program data. Each local bitline of a column is selectively coupled to a respective global bitline through a select device 320, shown in the present example as an n-channel transistor. Most of the aforementioned elements are annotated at least once in FIG. 11, so as not to obscure the features of the drawing.

A block decoder 322 receives row address information (not shown), and can decode it to provide local bitline select signals for controlling each set of select devices 320 corresponding to a super block. For example, the select devices 320 connected to the local bitlines 312 of first super block 302 all receive local bitline select signal S_LBL0, while the select devices 320 connected to the local bitlines 312 of last super block 306 all receive local bitline select signal S_LBLp, where p can be any non-zero integer value representing a last super block of the memory array. In the present embodiment, activation of each local bitline select signal is based on decoding of higher order bits of a memory block address received by block decoder 322. Therefore, the block decoder 322 is configured to enable a single local bitline select signal during read operations, and is configured to disable all local bitline select signals during an erase operation, as will be discussed in further detail later.

In addition to providing the local bitline select signals, the block decoder 322 provides block signals decoded from the memory block address. A first block signal BS0 is shown at the bottom part of FIG. 11 while a last block signal BSn is shown at the top part of FIG. 11. The block select signals are used for selecting a specific memory block (not shown) that is to receive row signals for a memory operation. Each block select signal is received by a respective high voltage level shifter 324 for enabling passage of global row signals to the selected memory block as local row signals. Global row signals can include global wordlines GWL, a string select line GSSL and a source select line GGSL. Local row signals are provided to each memory block of NAND cell strings, and can include local wordlines WL, a local string select line SSL and a local source select line GSL.

In the present embodiment of FIG. 11, a voltage control circuit 326 is shown on the opposite side of super blocks 302, 304 and 306, but could be integrated with block decoder 322. The voltage control circuit 326 provides at least one erase voltage to each group of memory blocks, such as super blocks 302, 304 and 306 for example. The erase voltage is selectively provided to each super block for erasing at least one memory block of the selected super block. For example, the voltage control circuit 326 can provide an erase voltage to super block 304 for erasing a selected memory block therein. The same higher order bits of the memory block address used by block decoder 322 can be used by voltage control circuit 326 to selectively apply the erase voltage to a specific super block, and in certain embodiments, to selectively apply the erase voltage to a specific memory block within the selected super block. Examples of how an erase voltage is used to erase NAND memory cell strings have been previously discussed in relation to the NAND cell strings of FIGS. 5, 6A, 7A and 8.

The general erase operation for the embodiment of FIG. 11 now follows. Memory blocks connected to the same local bitlines 312 have memory cell bodies which are electrically isolated from the bodies of select devices 320 that connect those local bitlines 312 to the global bitline 314. During an erase operation, all the select devices 320 are turned off. If the SL or the pocket well of a selected memory block is biased to an erase voltage for erasing memory cells therein, the local bitlines may charge due to the previously discussed leakage mechanisms. However, because the select devices 320 are formed such that their bodies are electrically isolated from the cell bodies subjected to the erase voltage, any source line SL or pocket well biased to the erase voltage will have no effect on the bodies of the select devices. Therefore, the remaining unselected super blocks which do not receive the erase voltage are prevented from inadvertently receiving the erase voltage since the global bitlines are electrically isolated from all the local bitlines, including the local bitlines connected to the memory block being erased, which may have charged during the erase operation. Therefore the global bitlines 314 do not charge because the select devices 320 cut off the current path between the global bitlines 314 and the NAND cell strings 308 whenever it is desired that no current flows between the NAND cell strings 308 and the global bitlines 314. This is achieved by turning off the select devices 320 through the local bitline select signals.

Figure 12A:
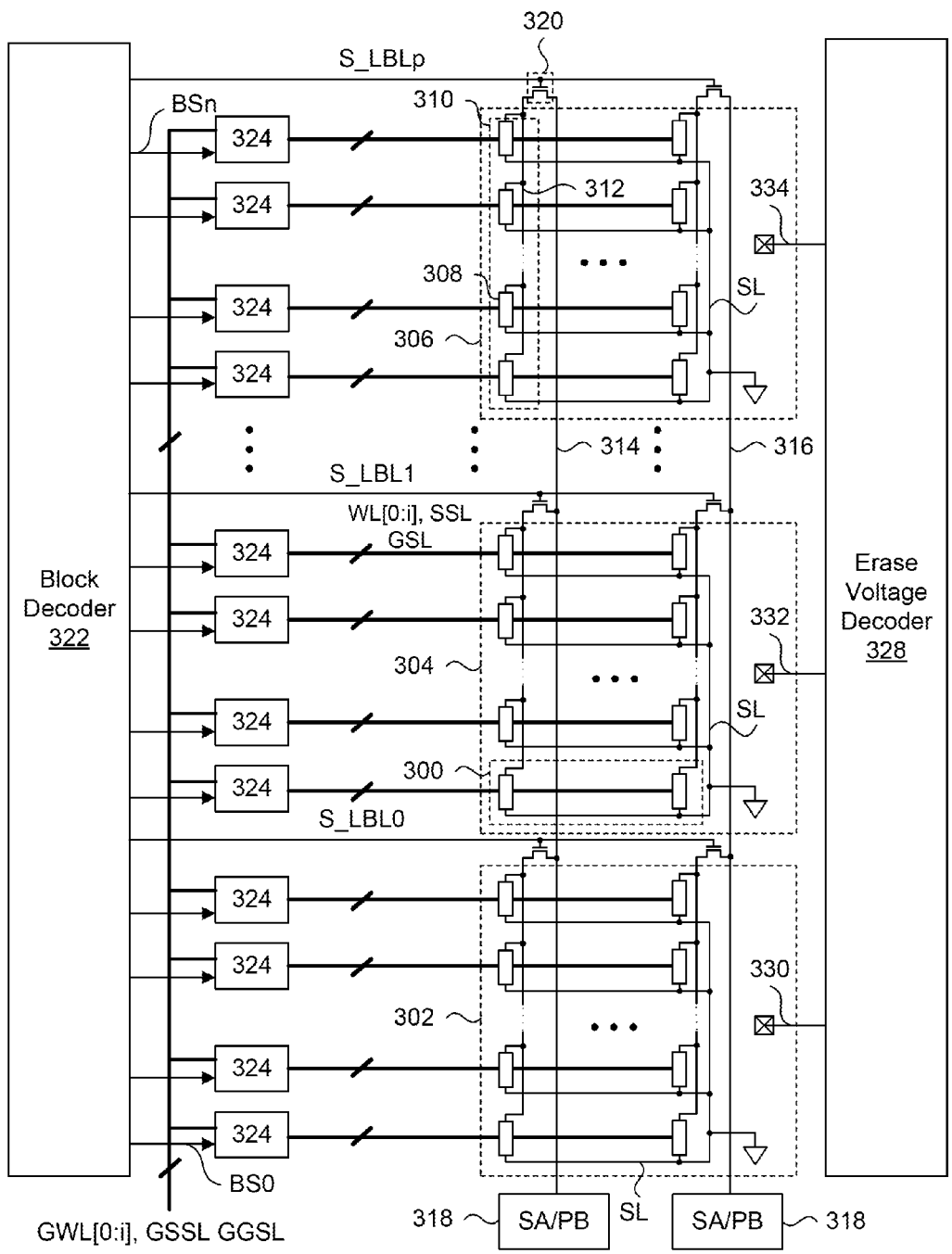
FIG. 12A is a block diagram of a non-volatile memory array having a hierarchical bitline configuration, according to an embodiment of the present disclosure.

FIG. 12A shows the non-volatile memory array of FIG. 11 composed of either the planar NAND cell strings of FIG. 5 or the vertical channel NAND cell strings of FIG. 7A. Alternately, any NAND cell string in which the cells are erased by having their cell bodies biased to an erase voltage can be used in this embodiment. In FIG. 12A, the same features appearing in FIG. 11 are annotated with the same reference numbers. As in FIG. 11, FIG. 12A is a block diagram of a non-volatile memory array having a hierarchical bitline configuration, where select devices for electrically connecting each bitline of a specific group of memory cells to a global bitline have device bodies that are electrically isolated from the bodies of those memory cells. Each of the super blocks 302, 304 and 306 of FIG. 12A is shown with NAND cell strings and some of their interconnections details. For simplicity, the NAND cell strings 308 are depicted as rectangles and the individual cell transistors and select transistors are not shown. Each column of NAND cell strings 308 within a super block is referred to as a super string 310, one of which is annotated in super block 306. Each super string is connected to a respective local bitline 312, one of which is annotated in super block 306. The NAND cell strings of each super block have source lines SL connected to VSS.

The super strings 310 are arranged in columns, and all the local bitlines of a column are selectively coupled to a global bitline. Each global bitline is connected to a sense amplifier/page buffer circuit 318 for sensing data and for providing program data. Each local bitline of a column is selectively coupled to a respective global bitline through a select device 320, shown in the present example as an n-channel transistor. Most of the aforementioned elements are annotated once in FIG. 12A, so as not to obscure the features of the drawing.

In the present embodiment of FIG. 12A, the voltage control circuit 326 of FIG. 11 is embodied as an erase voltage decoder 328. The erase voltage decoder 328 is included for NAND cell strings 308 configured as planar or vertical channel NAND cell strings, or other NAND cell strings in which the cell bodies are biased to the erase voltage for erasing of the cells. Accordingly, the memory blocks 300 of each super block can all be formed in one pocket well isolated from pocket wells within which memory blocks of another super block are formed. Therefore, the erase voltage decoder 328 includes erase voltage lines 330 and 332 and 334, each connected to a pocket well of one super block for selective application of an erase voltage. More specifically, the erase voltage decoder 328 drives one of the erase voltage lines 330 and 332 and 334 to an erase voltage during erase operations. In read or programming operations, the erase voltage decoder 328 drives all the erase voltage lines 330 and 332 and 334 to VSS. In the presently shown example where one erase voltage line is connected to a corresponding super block pocket well, the erase voltage decoder can include decoding logic to decode higher order bits of the memory block address for selecting which erase voltage line to drive with the erase voltage. Each erase voltage line shown in FIG. 12A can represent a group of erase voltage lines each connected at different areas of the pocket well of the super block for distributed application of the erase voltage.

In an alternate configuration, each memory block 300 of a super block can be formed in its own pocket well. Therefore each erase voltage line, such as erase voltage line 330, can be composed of individual erase voltage sub-lines, each connected to a respective memory block pocket well. Each erase voltage sub-line can be decoded at the block address level for selective application of the erase voltage to only the pocket well of a selected memory block.

As in the embodiment of FIG. 11, memory blocks connected to the same local bitlines 312 in FIG. 12A have memory cell bodies which are electrically isolated from the bodies of select devices 320 that connect those local bitlines 312 to the global bitline 314. During an erase operation, all the select devices 320 are turned off. If the pocket well of a selected memory block is biased to an erase voltage for erasing memory cells therein, the local bitlines may charge due to the previously discussed leakage mechanisms. However, because the select devices are formed such that their bodies are electrically isolated from the cell bodies subject to the erase voltage, any pocket well biased to the erase voltage will have no effect on the bodies of the select devices. Therefore the global bitlines 314 do not charge because the select devices 320 cut off the current path between the global bitlines 314 and the NAND cell strings 308. Accordingly, the remaining unselected super blocks which do not receive the erase voltage are prevented from inadvertently receiving the erase voltage since the global bitlines are electrically isolated from all the local bitlines, including the local bitlines connected to the memory block being erased, which may have charged during the erase operation.

Therefore by using the memory array embodiment of FIG. 12A, charge up time of the pocket p-well or p-wells of the super block having a memory block to be erased is shortened relative to known memory array configurations which have bitlines connected to all the memory blocks of the memory array, since there is no leakage path of current to the global bitlines and the other super block local bitlines and pocket wells. This means that lower power consumption and faster charge up time is realized relative to memory arrays of the same size where bitlines are shared across all memory blocks. Alternately, smaller sized high voltage pumps for generating the erase voltage can be used to further reduce power consumption in applications where high speed erasing is not required.

Figure 12B:
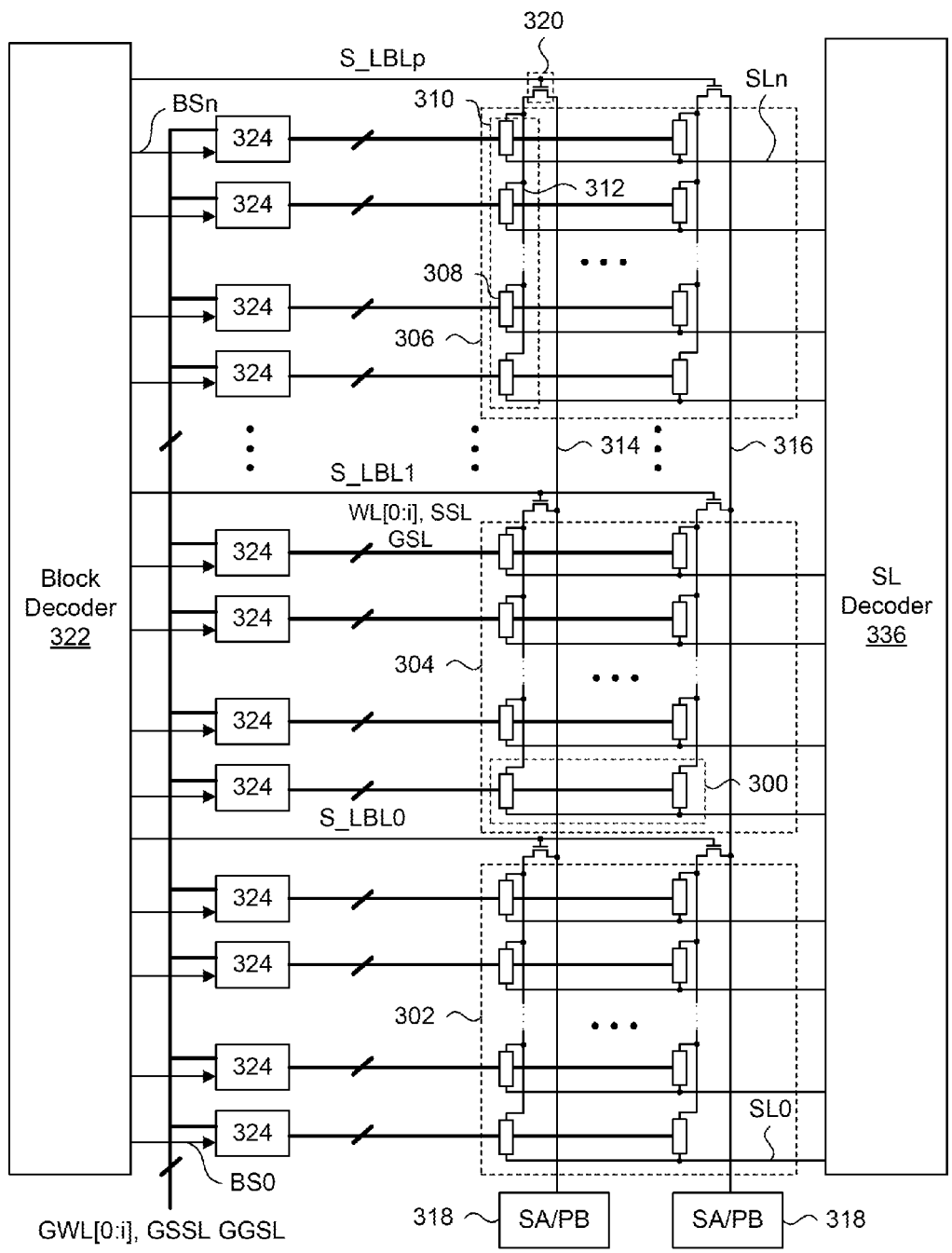
FIG. 12B is a block diagram of a non-volatile memory array having a hierarchical bitline configuration, according to another embodiment of the present disclosure.

FIG. 12B shows the non-volatile memory array of FIG. 11 composed of either the vertical channel NAND cell strings of FIG. 6A or FIG. 8. Alternately, any NAND cell string in which the cells are erased via GIDL current can be used in this embodiment. In FIG. 12B, the same features appearing in FIGS. 11 and 12A are annotated with the same reference numbers. It is noted that the memory blocks of NAND cell strings of FIG. 12B do not have to be formed in their own pocket wells, as their cell bodies are electrically isolated from the substrate, and therefore, isolated from the body of the select device 320. As in FIG. 12A, FIG. 12B is a block diagram of a non-volatile memory array having a hierarchical bitline configuration, where select devices for electrically connecting each bitline of a specific group of memory cells to a global bitline have device bodies that are electrically isolated from the bodies of those memory cells. Once again for simplicity, the NAND cell strings 308 are depicted as rectangles and the individual cell transistors and select transistors are not shown. In the embodiment of FIG. 12B, the NAND cell strings of each memory block 300 are connected to a respective source line, and the voltage control circuit 326 of FIG. 11 is embodied as a source line decoder 336. The source line decoder 336 is included for NAND cell strings 308 where the erase mechanism is based on GIDL current due to biasing of a source line of the NAND cell string with an erase voltage level. A first source line SL0 is shown at the bottom part of FIG. 12A for one memory block 300 and a last source line SLn is shown at the top part of FIG. 12A for another memory block 300. The source line decoder 336 can decode the memory block address for activating any one of the source lines. The source line decoder 336 can thus selectively drive the source line of each memory block 300 to an erase voltage during erase operations.

In the embodiment of FIG. 12B, memory blocks connected to the same local bitlines 312 have memory cell bodies which are electrically isolated from the bodies of select devices 320 that connect those local bitlines 312 to the global bitline 314. During an erase operation, all the select devices 320 are turned off. If the SL of a selected memory block is biased to an erase voltage for erasing memory cells therein, the local bitlines may charge due to the previously discussed leakage mechanisms. However, because the select devices are formed such that their bodies are electrically isolated from the cell bodies subject to the erase voltage, any source line SL biased to the erase voltage will have no effect on the bodies of the select devices. Therefore the global bitlines 314 do not charge because the select devices 320 cut off the current path between the global bitlines 314 and the NAND cell strings 308.

Figure 13:
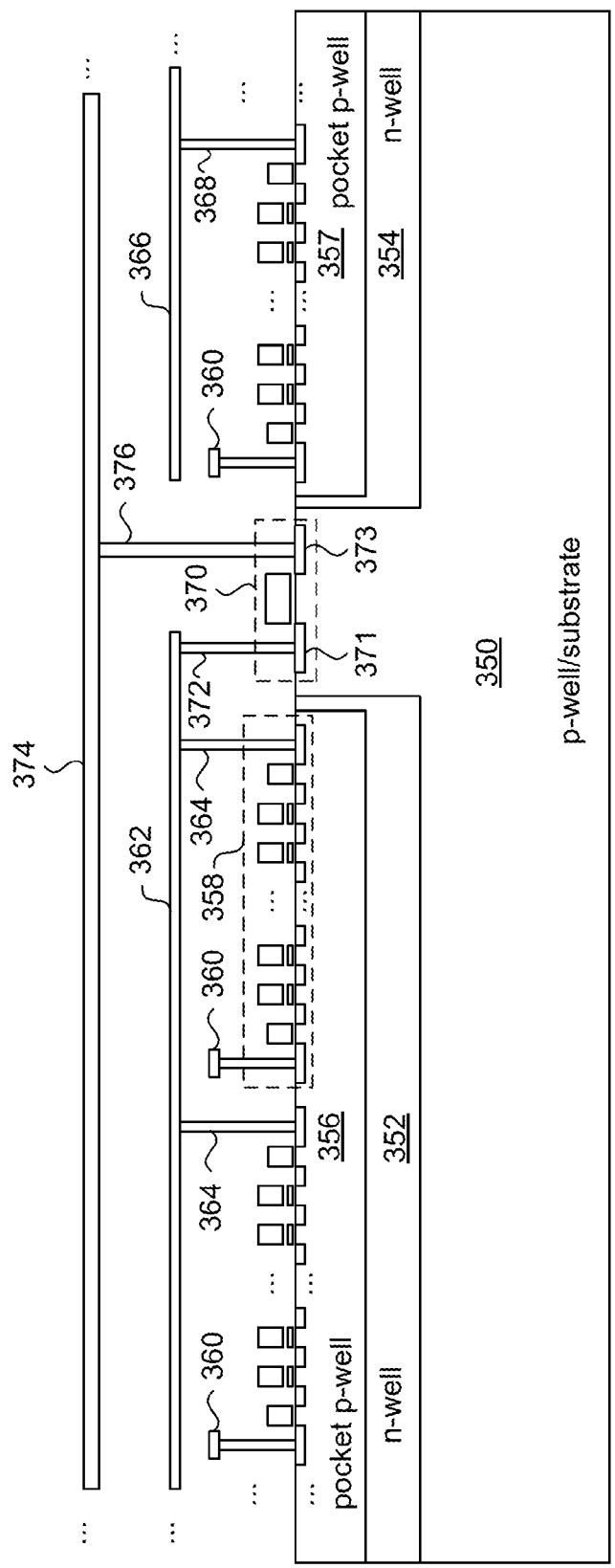
FIG. 13 is a cross-sectional view of a portion of a planar NAND cell string memory array with a select device formed in a separate pocket well, according to an embodiment of the present disclosure.

Therefore by using the memory array embodiment of FIG. 12B, charge up time of the cell bodies of the NAND cell strings eraseable by GIDL current is shortened relative to known memory array configurations which have bitlines connected to all the memory blocks of the memory array. Because GIDL current is low, any leakage to other parts of the memory array, such as to bitlines of non selected memory blocks, will increase charge up time of the selected cell bodies. Since there is no leakage path of current to the global bitlines and the other super block local bitlines in the present embodiment, lower power consumption and faster charge up time is realized relative to memory arrays of the same size where bitlines are shared across all memory blocks. Alternately, smaller sized high voltage pumps for generating the erase voltage can be used to further reduce power consumption in applications where high speed erasing is not required. FIG. 13 is a cross-sectional view of a portion of a memory array to facilitate an understanding of an embodiment of the present disclosure. More specifically, FIG. 13 is a cross-sectional view of planar NAND cell strings formed in a substrate of the semiconductor memory. The substrate 350 can be either a p-type substrate or a large p-type well, having formed therein n-wells 352 and 354. Formed within n-well 352 is a pocket p-well 356, and formed within n-well 354 is another pocket p-well 357. Pocket p-wells 356 and 357 are electrically isolated from each other, and include planar NAND cell strings, of which only one is annotated with reference number 358. In the present example, the NAND cell strings 358 of pocket p-well 356 can be part of one grouping of memory blocks, such as a super block, where the NAND cell strings 358 are connected to a first local bitline 362 via contact plugs 364. The NAND cell strings 358 of pocket p-well 357 can be part of a second grouping of memory blocks, such as a super block, where the NAND cell strings 358 are connected to a second local bitline 366 via contact plugs 368. The dopant types of the substrate and the wells can be reversed in an alternate embodiment.

Electrically isolated from both pocket p-wells 356 and 357 is select device 370 formed directly in the p-type substrate 350 and external to the pocket p-wells 356 and 357. Select device 370 has a first n-diffusion region 371 connected to first local bitline 362 via contact plug 372, and a second n-diffusion region 373 connected to global bitline 374 via contact plug 376. While not shown in FIG. 13, the second local bitline 366 is connected to another select device, which is also connected to the global bitline 374. When pocket p-well 356 is biased to an erase voltage for erasing its NAND cell strings 358, the select device 370 is unaffected by the erase voltage since it is electrically isolated from pocket p-well 356. And because it is turned off during an erase operation, select device 370 does not couple any voltage of first local bitline 362 to the global bitline 374. In the example of FIG. 13, it is assumed that the pocket p-wells 356 and 357 can each receive an erase voltage for erasing one selected memory block formed therein. As previously discussed, the remaining unselected memory blocks in the same pocket p-well as the selected memory block being erased can have their row signals floating to inhibit erasure.

Figure 14A:
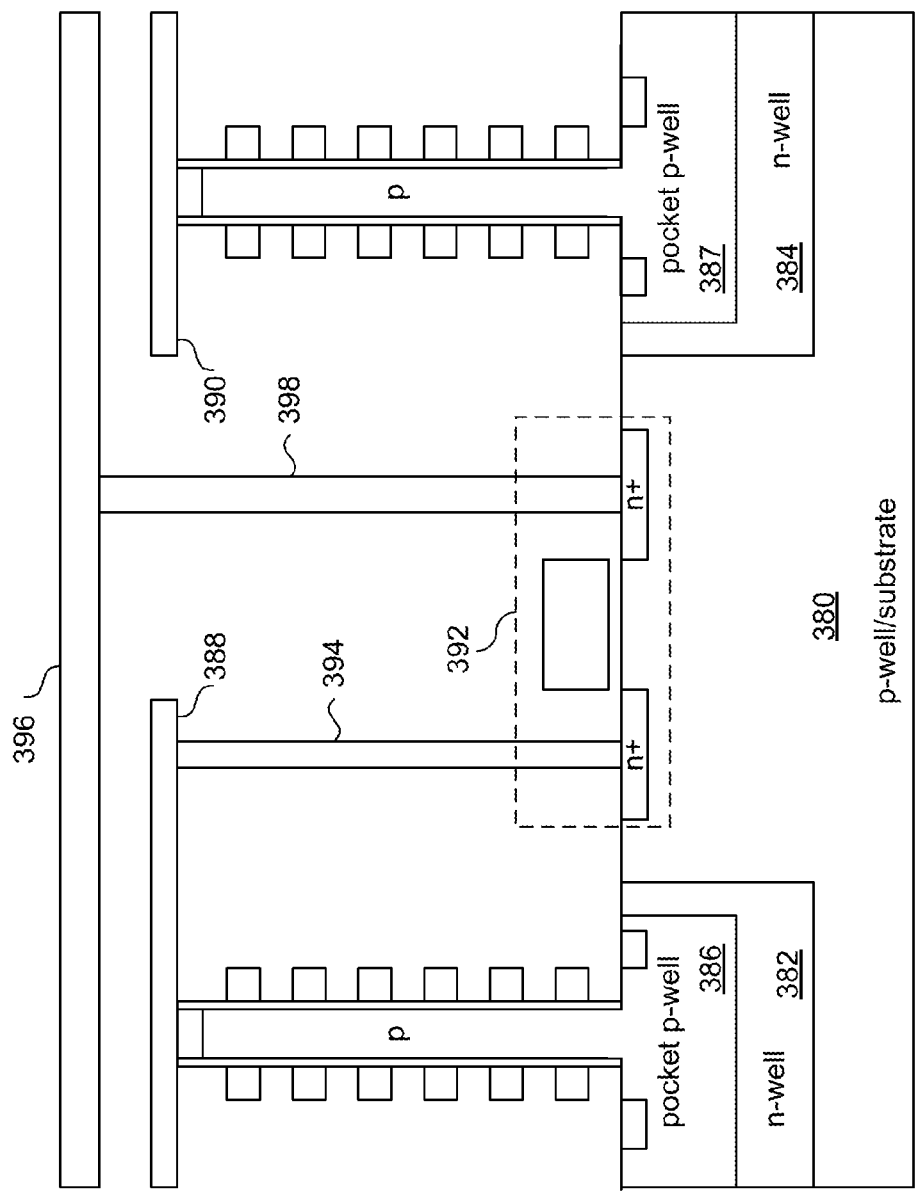
FIG. 14A is a cross-sectional view of a portion of a 3D stacked NAND cell string memory array with a select device formed in a separate pocket well, according to an embodiment of the present disclosure.

FIG. 14A is an alternate cross-sectional view of a portion of a memory array showing vertical channel NAND cell strings of the type shown in FIG. 7A, in order to facilitate an understanding of another embodiment of the present disclosure. The substrate 380 is a p-well or a p-type substrate having formed therein n-wells 382 and 384. Formed within n-well 382 is pocket p-well 386, and formed within n-well 384 is pocket p-well 387, where pocket p-wells 386 and 387 are electrically isolated from each other, and each include vertical channel NAND cell strings. In the present example, the vertical channel NAND cell strings of pocket p-well 386 can be part of one grouping of memory blocks, such as a super block, where each vertical channel NAND cell string is directly connected to a first local bitline 388. The vertical channel NAND cell strings of pocket p-well 387 can be part of a second grouping of memory blocks, such as a super block, where each vertical channel NAND cell string is directly connected to a second local bitline 390.

Electrically isolated from both pocket p-wells 386 and 387 is select device 392 formed directly in the p-type substrate 380. Select device 392 has a first n-diffusion region connected to first local bitline 388 via contact plug 394, and a second n-diffusion region connected to global bitline 396 via contact plug 398. While not shown in FIG. 14, the second local bitline 390 is connected to another select device, which is also connected to the global bitline 396. When pocket p-well 386 is biased to an erase voltage for erasing its vertical channel NAND cell strings, the select device 392 is unaffected by the erase voltage since it is electrically isolated from pocket p-well 386. And because it is turned off during an erase operation, select device 392 does not couple any voltage of first local bitline 388 to the global bitline 396. In the example of FIG. 14, it is assumed that the pocket p-wells 386 and 387 each receives an erase voltage for erasing one selected memory block formed therein. As previously discussed, the remaining unselected memory blocks in the same pocket p-well can have their row signals floating to inhibit erasure.

Figure 14B:
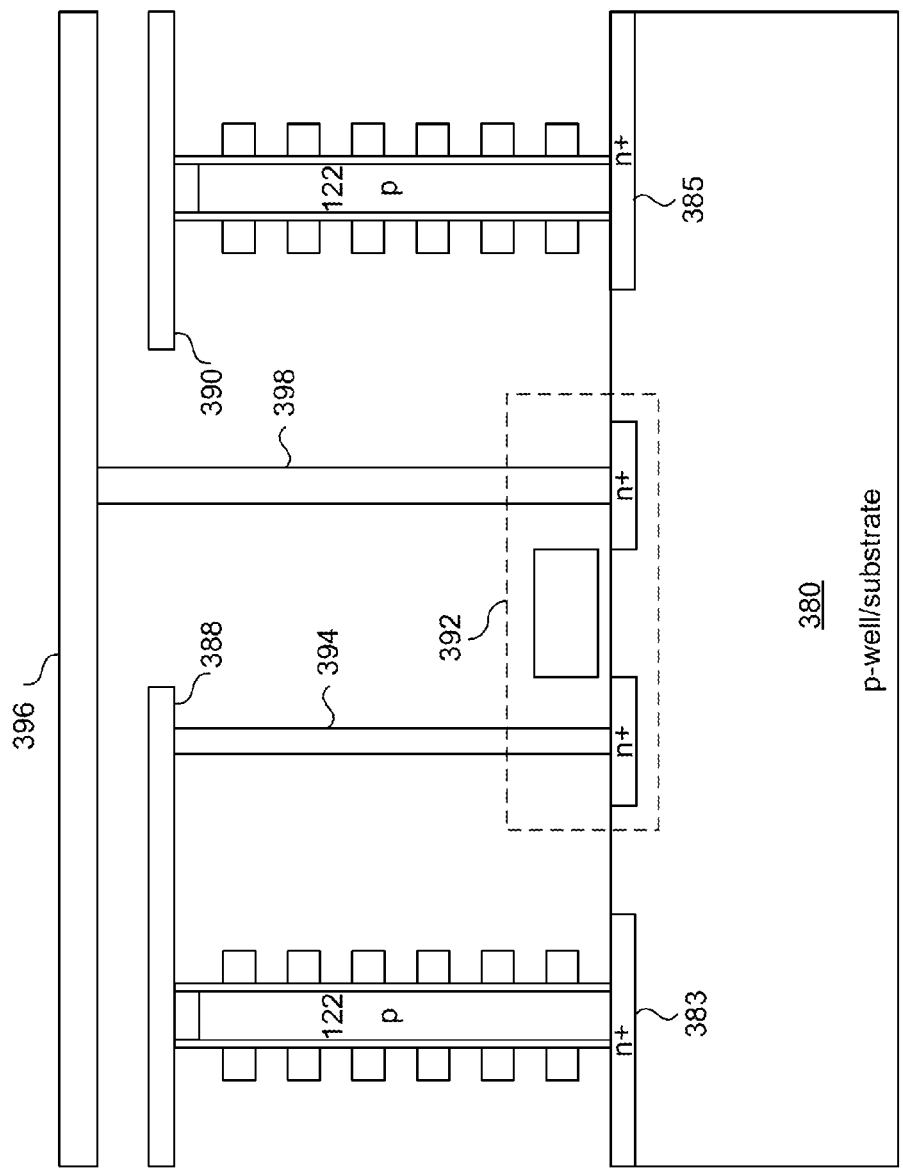
FIG. 14B is a cross-sectional view of a portion of a 3D stacked NAND cell string memory array with a select device, according to another embodiment of the present disclosure.

FIG. 14B is an alternate cross-sectional view of a portion of a memory array showing vertical channel NAND cell strings of the type shown in FIG. 6A, in order to facilitate an understanding of another embodiment of the present disclosure. The diagram of FIG. 14B is similar to that of FIG. 14A, and therefore the same features are annotated with the same reference numbers. In the embodiment of FIG. 14B, the NAND cell strings are formed directly in the p-type substrate 380, hence no n-well 382 or pocket p-well 386 within the n-well 382 is needed. In the present example, the vertical channel NAND cell strings (only one shown) connected to the source line 383 can be part of one grouping of memory blocks, such as a super block, where each vertical channel NAND cell string is directly connected to a first local bitline 388. The vertical channel NAND cell strings (only one shown) connected to the source line 385 can be part of a second grouping of memory blocks, such as a super block, where each vertical channel NAND cell string is directly connected to a second local bitline 390. As previously discussed for this type of NAND cell string, the bodies 122 are electrically isolated from the substrate 380 by the n+ diffusion source lines 383 and 385. Accordingly, the vertical channel NAND cell strings of FIG. 14B are electrically isolated from the body of select device 392, which is formed directly in the substrate 380.

Figure 15:
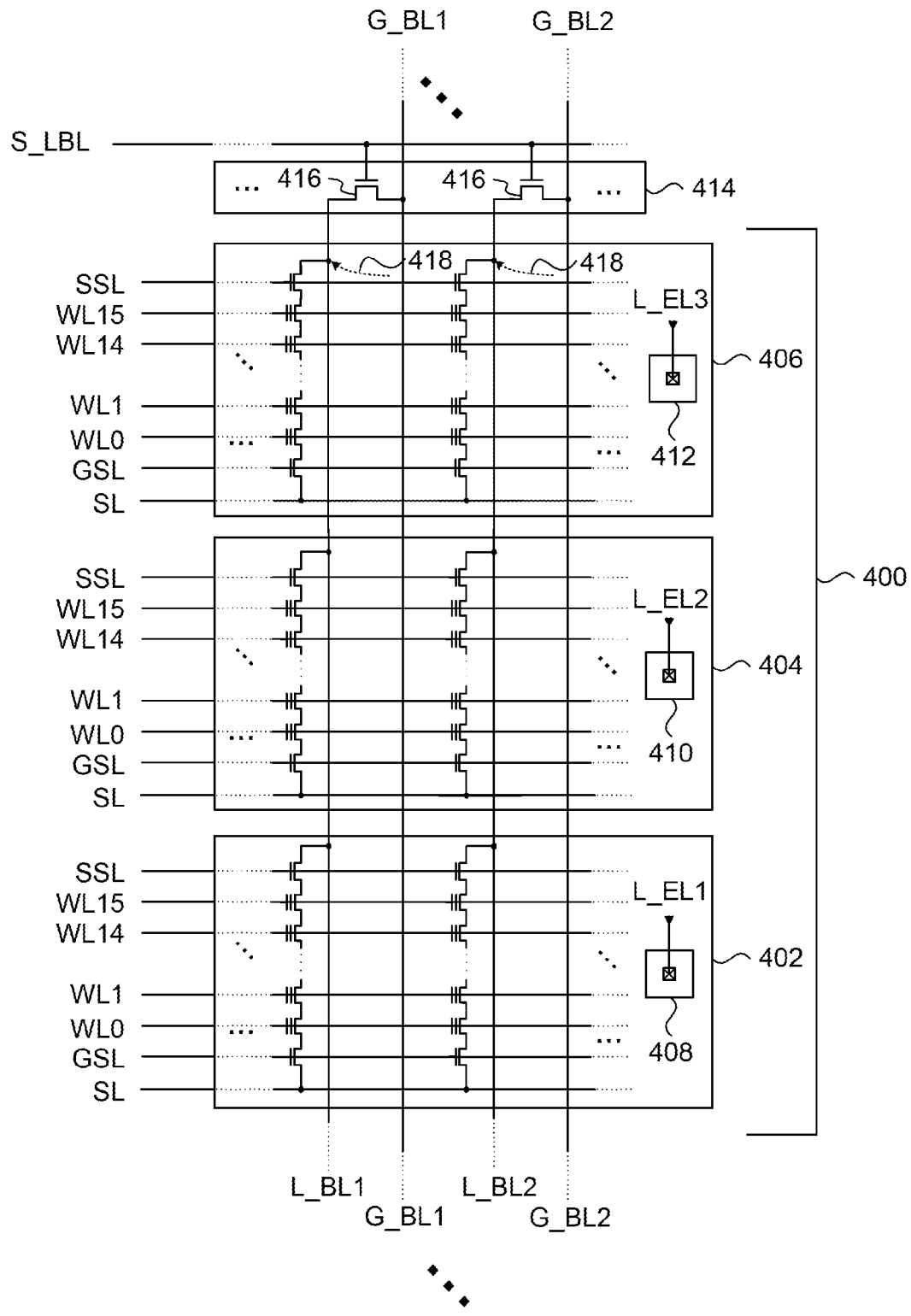
FIG. 15 is a circuit schematic of a super block with individually eraseable memory blocks, according to an embodiment of the present disclosure.

FIG. 15 is a circuit schematic illustrating an alternate configuration, according to an embodiment of the present disclosure. One super block 400 is shown in FIG. 15, which includes three memory blocks each formed in respective pocket wells 402, 404 and 406. Each pocket well includes planar NAND cell strings, where pocket well 402 includes a contact 408 receiving local erase voltage L_EL1, pocket well 404 includes a contact 410 receiving local erase voltage L_EL2 and pocket well 406 includes a contact 412 receiving local erase voltage L_EL3. All the NAND cell strings of a column in super block 400 are connected to the same local bitline. Two local bitlines L_BL1 and L_BL2 are shown in FIG. 15. Formed in a different pocket well 414 are select devices 416 for electrically connecting local bitline L_BL1 to global bitline G_BL1 and local bitline L_BL2 to global bitline G_BL2. The select devices 416 are controlled by a local bitline select signal S_LBL. In an example operation, it is assumed that memory block in pocket well 406 is selected to be erased and L_EL3 is biased to the erase voltage level. While the cell bodies are charged to the erase voltage level, the erase voltage of the pocket well 406 leaks through the bitline contact and charges the local bitlines L_BL1 and L_BL2 as shown by arrows 418. However, because select devices 416 are turned off and have bodies electrically isolated from pocket well 406, the voltage on local bitlines L_BL1 and L_BL2 is not passed to global bitlines G_BL1 and G_BL2.

Figure 16:
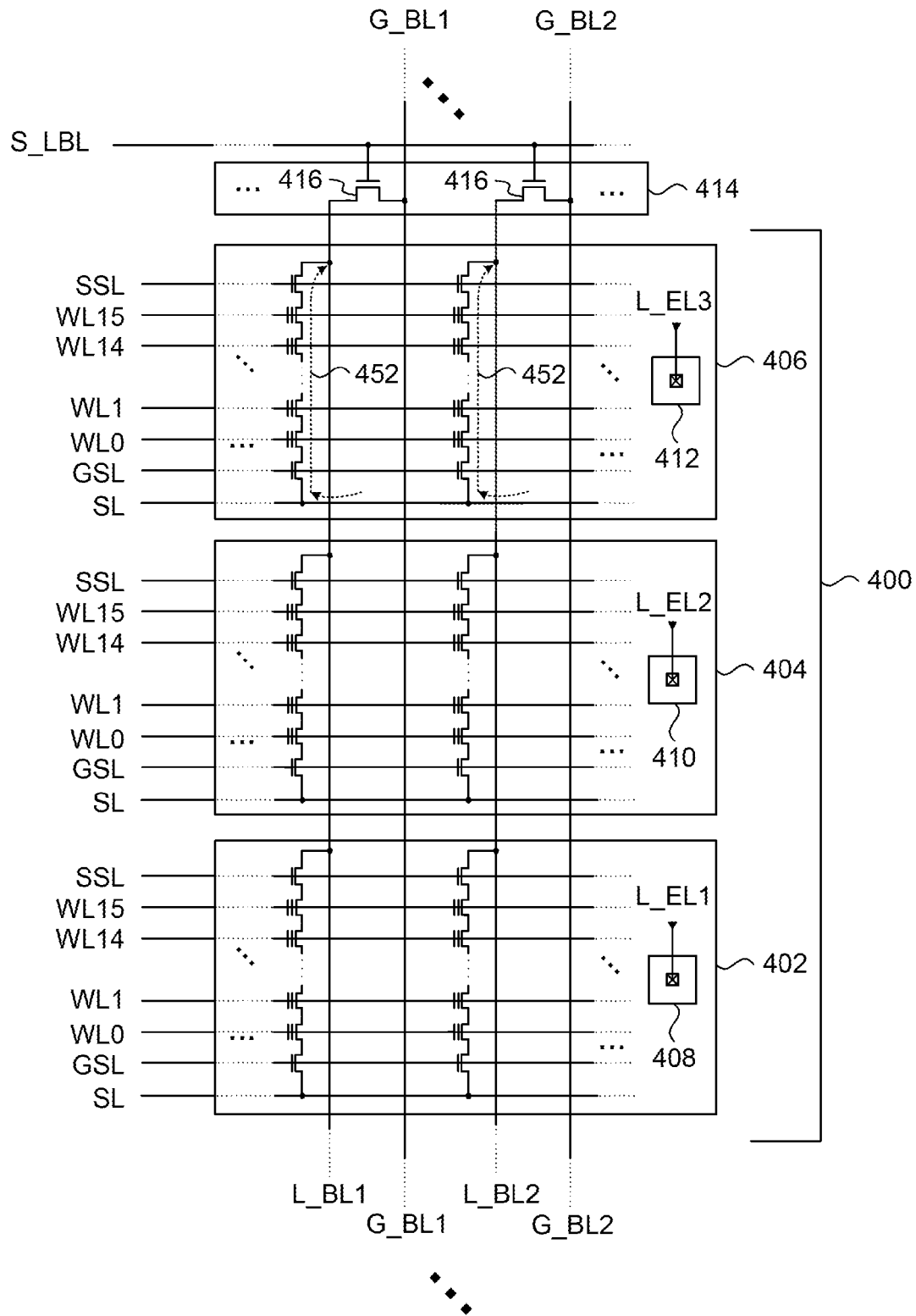
FIG. 16 is a circuit schematic of a super block with individually eraseable memory blocks, according to another embodiment of the present disclosure.

FIG. 16 is a circuit schematic similar to that of FIG. 15, except that the memory blocks include vertical channel NAND cell strings such as those shown in FIG. 7A. The same features are annotated with the same reference numbers shown in FIG. 15. As in the example embodiment of FIG. 15, each memory block is formed within its own respective pocket well 402, 404 and 406, where each pocket well receives local erase voltages L_EL1, L_EL2 and L_EL3 respectively. In the present example embodiment of FIG. 16, it is assumed that the memory block formed in pocket well 406 is selected to be erased, therefore L_EL3 is driven to the erase voltage. Because the body of the NAND cells strings are directly connected to the pocket well, current leaks from the erase voltage biased pocket well 406 through the bodies of the vertical channel NAND cell strings and into the local bitlines L_BL1 and L_BL2, as shown by arrows 452. However, because select devices 416 are turned off and have bodies electrically isolated from pocket well 406, the voltage on local bitlines L_BL1 and L_BL2 is not passed to global bitlines G_BL1 and G_BL2.

Figure 17:
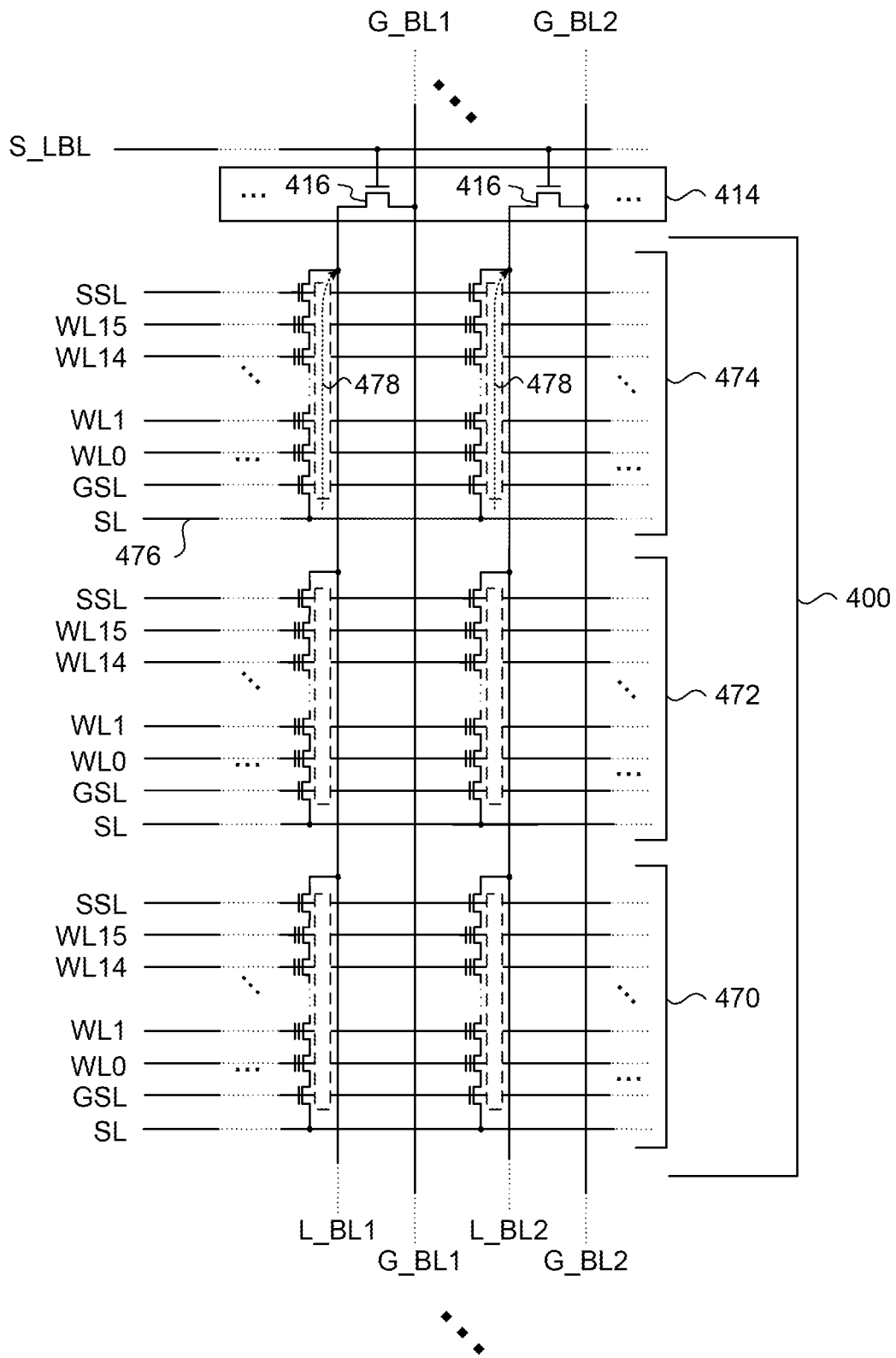
FIG. 17 is a circuit schematic of a super block with individually eraseable memory blocks, according to another embodiment of the present disclosure.

FIG. 17 is a circuit schematic similar to that of FIG. 15, except that the memory blocks include vertical channel NAND cell strings such as those shown in FIG. 6A. The same features are annotated with the same reference numbers shown in FIG. 15. The super block 400 includes memory blocks 470, 472 and 474. Each NAND cell string has a cell body that is electrically isolated from the substrate it is formed on. In the present example embodiment of FIG. 17, it is assumed that the NAND cell strings of memory block 474 are selected to be erased. Therefore the source line 476 is biased to an erase voltage level. GIDL current in the cell bodies leaks into the local bitlines L_BL1 and L_BL2, as shown by arrows 478. However, because select devices 416 are turned off and have bodies electrically isolated from the cell bodies of the NAND cell strings of memory blocks 470, 472 and 474, the voltage on local bitlines L_BL1 and L_BL2 is not passed to global bitlines G_BL1 and G_BL2.

In the previously shown example embodiments of FIGS. 13 to 17, the NAND cell strings are either formed as planar NAND cell strings in the substrate, or as vertical channel NAND cell strings extending in a direction substantially perpendicular to the surface of the substrate. In each of these embodiments, the select devices are formed in their own pocket wells to ensure electrical isolation from the cell bodies of the NAND cell strings. According to an alternate embodiment shown in FIG. 18, the select devices do not have to be formed in a separate pocket well.

Figure 18:
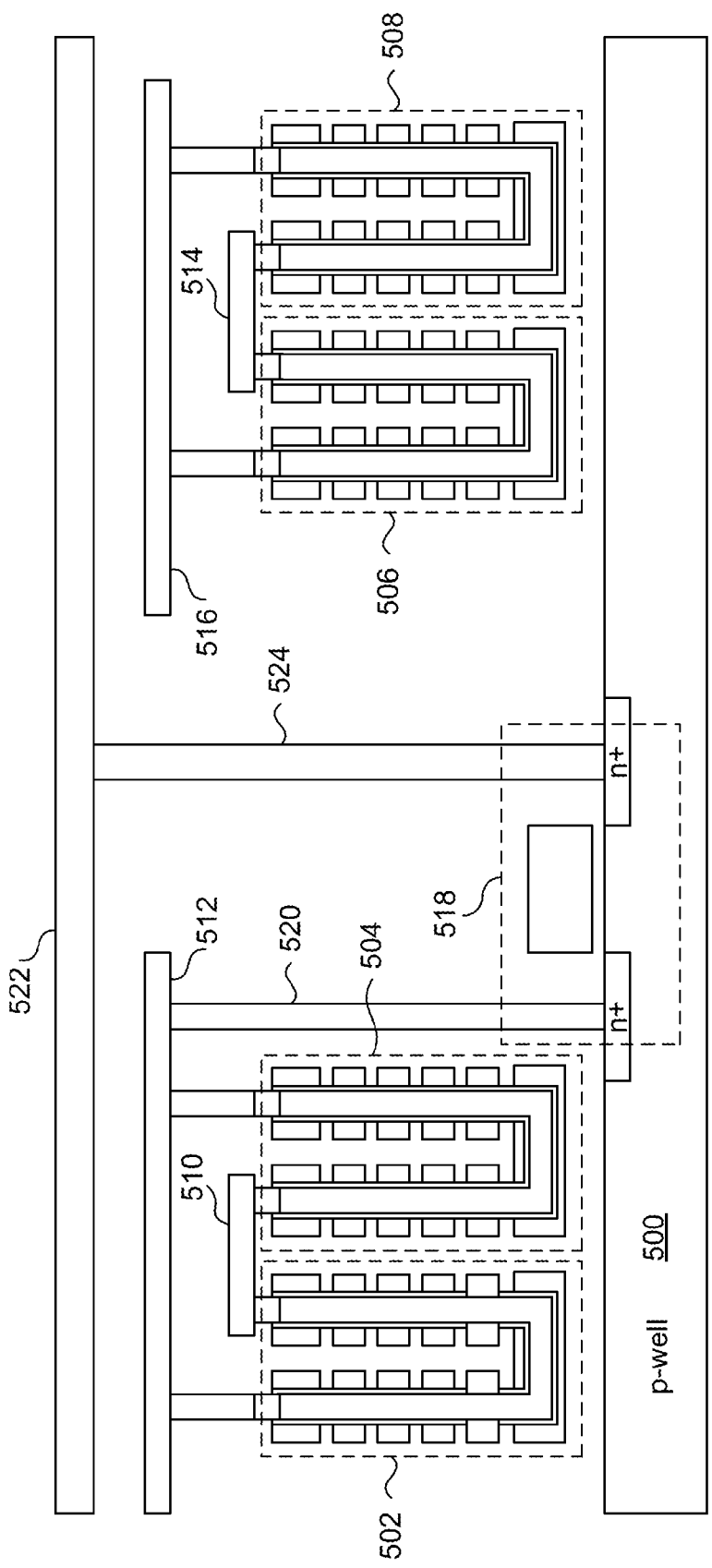
FIG. 18 is a cross-sectional view of a portion of a 3D stacked NAND cell string memory array with a select device formed in a substrate, according to an embodiment of the present disclosure; and, FIG. 19 is a cross-sectional view of a portion of a 3D stacked NAND cell string memory array with a select device formed in a substrate, according to an alternate embodiment of the present disclosure.

FIG. 18 is a cross-sectional view of a portion of a memory array showing pipe NAND cell strings of the type shown in FIG. 8 where the body of the NAND string is confined within the pipe, in order to facilitate an understanding of another embodiment of the present disclosure. In this embodiment, the separation of the substrate of the pipe NDN cell strings and the substrate of the select devices is achieved via a hybrid vertical channel/planar select gate scheme. The substrate 500 is a pocket p-well or a p-type substrate. Pipe NAND cell strings 502, 504, 506 and 508 are formed above the surface of substrate 500. In the present example, pipe NAND cell strings 502 and 504 are connected to the same source line 510, and can be part of one grouping of memory blocks, such as a super block. Pipe NAND cell strings 502 and 504 are each directly connected to a first local bitline 512. The pipe NAND cell strings 506 and 508 are connected to a different source line 514, and can be part of a second grouping of memory blocks, such as a super block. Pipe NAND cell strings 506 and 508 are each directly connected to a second local bitline 516.

Electrically isolated from pipe NAND cell strings 502, 504, 506 and 508 is select device 518, which has a first n-diffusion region connected to first local bitline 512 via contact plug 520, and a second n-diffusion region connected to global bitline 522 via contact plug 524. As the select device 518 is a conventional planar transistor formed on the common chip substrate 500, the substrate 500 of the select device is separated spatially and electrically from the bodies of the pipe NAND cell strings 502 and 504 which are confined within the pipe structure. While not shown in FIG. 14, the second local bitline 516 is connected to another select device, which is also connected to the global bitline 522.

When source line 510 is biased to an erase voltage for erasing its pipe NAND cell strings 502 and 504, their bodies are positively charged and the first local bitline 512 is charged through the forward biased pn junction of the SSL transistor as previously described. However, the current path from the first local bitline 512 to the global bitline 512 is blocked by the turned-off select device 518. Therefore the p-well substrate 500 remains uncharged by the erase voltage since it is electrically isolated from the bodies of pipe NAND cell strings 502 and 504.

In the previously shown example embodiments of FIGS. 13, 14, 15, 16, 17 and 18, the groups of NAND cell strings are not limited to the number of NAND cell strings shown in the drawings, as each group can include any number of NAND cell strings. For example, a super block can include any number of memory blocks of NAND cell strings, where each memory block can include any number of NAND cell strings.

The bias conditions for selected and unselected memory blocks of planar NAND cell string blocks was previously shown in Table 1. Example bias conditions for selected super blocks, selected and unselected memory blocks of the selected super block, and unselected super blocks is shown in Table 3 below, where the NAND cell strings are assumed to have a vertical 3D arrangement where the erase voltage Verase is supplied through the source lines and the charging of the cell bodies is achieved via GIDL current. However, it is noted that the cell body bias voltage can be supplied through other lines for differently configured cell structures.

TABLE 3

| | Super Block to which selected block belongs | | Other Super Blocks Unselected |
|---|---|---|---|
| | Selected Block | Unselected Block | Block |
| Global Bit lines (GBL) | Floating | | |
| Local Bitlines (LBL) | Clamped to Verase-0.6 V | | Floating |
| Local Bitline Select Line | 0 V | | 0 V |
| String Select Line (SSL) | Boosted to approx. 90% of Verase | Boosted to approx. 90% of Verase | Floating |
| Wordlines (WL0~WL15) | 0 V | Boosted to approx. 90% of Verase | Floating |
| Ground Select | Boosted to approx. | Boosted to approx. | Floating |

TABLE 3-continued

| | Super Block to which selected block belongs | | Other Super Blocks Unselected |
|---|---|---|---|
| | Selected Block | Unselected Block | Block |
| Line (GSL) Source Line (SL) | 90% of Verase Verase | 90% of Verase Verase | 0 V |

As shown in Table 3, the erase voltage Verase is not supplied to all source lines but only to the source lines of the super blocks which are selected by the corresponding local bitline select signal. In another embodiment the erase voltage Verase may be supplied only to the source line of the selected memory block whereby all other source lines which belong to the same super block as the selected memory block are held at 0V. The local bitline select signals are held at 0V for all super blocks during an erase operation.

A common advantage of all the presently described embodiments is that the global bitlines are not charged through the positively biased cell bodies during the erase operation, since they are isolated from all cell body nodes by the turned-off select devices. Likewise, only the local bitlines of the super block which contains the selected memory block to be erased are charged through the positively biased cell bodies. All other local bitlines are cut off from the positively charged cell bodies of the selected erase blocks by the select devices.

Two modes of controlling the select devices of the previously discussed embodiments are possible. In one embodiment, all the select devices are controlled to be concurrently turned off during an erase operation. Therefore it is not necessary to address decode the local bitline select signals from the memory block address. Accordingly, all the select devices remain turned on to electrically connect the local bitlines to the global bitlines during read and program operations, or other operations which requires data access to or from the memory cells.

In another embodiment, the presently disclosed hierarchical bitline arrangement can be utilized to prevent leakage current through unselected NAND cell strings during a read operation. In this embodiment, only the select devices coupled to the super block being accessed are turned on to couple the local bitlines to the global bitlines. All other select devices remain turned off as their corresponding super blocks are unselected for the read operation. Therefore the local bitline select signals are address decoded based on the grouping arrangement of the memory array. If the memory blocks are addressable, then groups of memory blocks are addressable by selecting a specific number of higher order bits of the memory block address information to decode. In this embodiment, all the select devices can be turned off during an erase operation.

Figure 19:
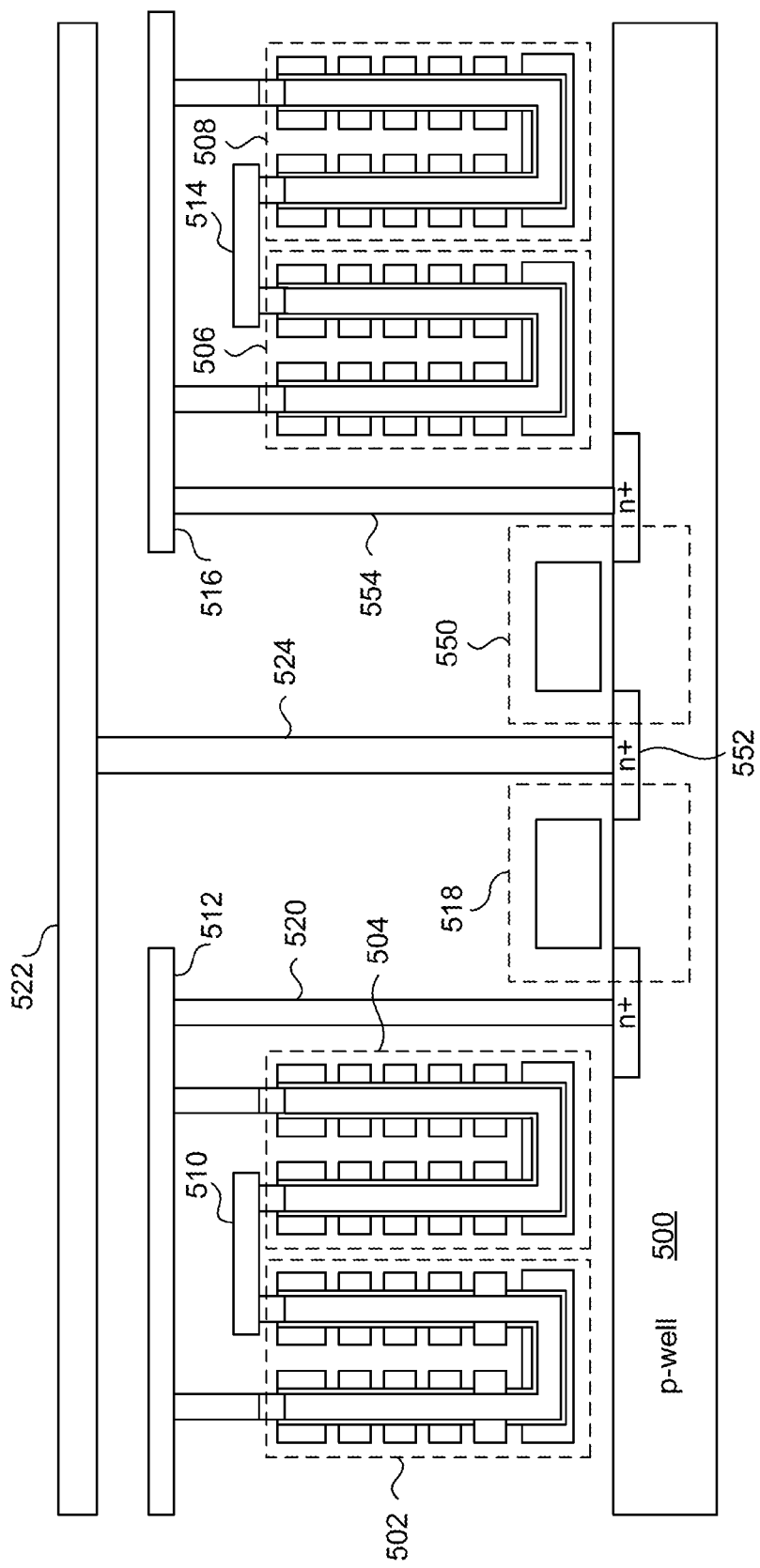

The embodiment of FIG. 18 can be arranged in a different way to minimize the number of global bitline contacts to the local bitlines of the super blocks. In the embodiment of FIG. 18, each super block has a set of global bitline contacts electrically connected to respective select devices. FIG. 19 illustrates an alternate arrangement whereby each adjacent pair of super blocks has select devices sharing the same global bitline contact. In FIG. 19, a select device 550 is formed proximate to select device 518 such that both select devices share the same n-diffusion region 552 which is electrically connected to the global bitline 522. In FIG. 19, the select device 550 has a contact plug 554 for electrically connecting the other n-diffusion region to the second local bitline 516.

The shared global bitline contact arrangement of FIG. 19 can be applied to the planar NAND memory array embodiment of FIG. 13, the vertical channel NAND string memory array of FIG. 14A, and the vertical channel NAND string memory array of FIG. 14B, by forming the select devices of adjacent super blocks sufficiently proximate to each other such that they share the same n-diffusion region and global bitline contact connected thereto.

The previously described embodiments of the disclosure apply to memory arrays composed of planar NAND cell strings, or vertical channel NAND cell strings. By limiting the charging to a subset of local bitlines of the memory array instead of all bitlines in the memory array, power consumption is reduced and charge up time for the cell bodies of the selected memory block is reduced.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

In the embodiments described above, the device elements and circuits are connected to each other as shown in the figures for the sake of simplicity. In practical applications these devices, elements circuits, etc., may be connected directly to each other or indirectly through other devices elements, circuits, etc. Thus, in an actual configuration, the elements, circuits and devices are coupled either directly or indirectly with each other.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A non-volatile memory comprising:
   at least two groups of non-volatile memory cells each eraseable in an erase operation;
   local bitlines coupled to the non-volatile memory cells of each group of the at least two groups;

a global bitline; and a plurality of select devices corresponding to a group of the at least two groups, the plurality of select devices configured to disconnect all the local bitlines of the group from the global bitline, wherein each of the plurality of select devices corresponding to the group are disabled in response to receiving a local bitline select signal.

2. The non-volatile memory of claim 1, wherein a body of a select device of the plurality of select devices for electrically connecting a local bitline coupled to the non-volatile memory cells of one group of the at least two groups to the global bitline, is electrically isolated from bodies of the non-volatile memory cells of the one group.

3. The non-volatile memory of claim 2, wherein the non-volatile memory cells are arranged as NAND cell strings.

4. The non-volatile memory of claim 3, wherein each of the at least two groups of non-volatile memory cells are formed in corresponding pocket wells of a substrate and are electrically isolated from each other.

5. The non-volatile memory of claim 4, wherein each of the corresponding pocket wells is connected to a local erase line for receiving an erase voltage.

6. The non-volatile memory of claim 5, wherein the select device is formed in a region of the substrate external to the pocket wells.

7. The non-volatile memory of claim 6, wherein the pocket wells have a first dopant type and are formed in a well having a second dopant type, the well being formed in the substrate having the first dopant type.

8. The non-volatile memory of claim 7, wherein the first dopant type is p-type and the second dopant type is n-type.

9. The non-volatile memory of claim 6, wherein the NAND cell strings comprise planar NAND cell strings.

10. The non-volatile memory of claim 6, wherein the NAND cell strings comprise three-dimension (3D) stacked NAND cell strings having a body with a vertical channel electrically coupled to a respective pocket well.

11. The non-volatile memory of claim 6, wherein a first select device corresponding to a first group of the at least two groups and a second select device corresponding to a second group of the at least two groups are formed adjacent to each other in the substrate and share a single contact to the global bit line.

12. The non-volatile memory of claim 3, wherein the NAND cell strings comprise 3D stacked NAND cell strings having bodies electrically isolated from a substrate.

13. The non-volatile memory of claim 12, wherein the plurality of select devices corresponding to each of the at least two groups are formed in the substrate.

14. The non-volatile memory of claim 13, wherein a source line is formed in the substrate and electrically isolates the bodies from the substrate.

15. The non-volatile memory of claim 14, wherein the bodies have a first dopant type, the source line has a second dopant type, and the substrate has the first dopant type.

16. The non-volatile memory of claim 15, wherein the first dopant type is p-type and the second dopant type is n-type.

17. The non-volatile memory of claim 13, wherein the source line is formed as a conductive line over the substrate.

18. The non-volatile memory of claim 13, wherein a first select device corresponding to a first group of the at least two groups and a second select device corresponding to a second group of the at least two groups are formed adjacent to each other in the substrate and share a single contact to the global bit line.

19. The non-volatile memory of claim 3, wherein each of the at least two groups includes at least two NAND memory blocks of NAND cell strings.

20. The non-volatile memory of claim 1, wherein each of the plurality of select devices corresponding to the group includes a pass transistor enabled by the local bitline select signal.

21. The non-volatile memory of claim 20, further including row decoding circuitry configured to provide the local bitline select signal corresponding to each pass transistor for disconnecting all the local bitlines from the global bitline in an erase operation.

22. The non-volatile memory of claim 1, wherein each of the at least two groups of non-volatile memory cells are formed in corresponding pocket wells of a substrate and are electrically isolated from each other, and wherein a body of a select device of the plurality of select devices is formed in a region of the substrate external to the pocket wells.

* * * * *